US012765200B2

(12) United States Patent
Shin et al.

(10) Patent No.: US 12,765,200 B2
(45) Date of Patent: Oct. 13, 2026

(54) DISPLAY DEVICE

(71) Applicant: Samsung Display Co., Ltd., Yongin-si (KR)

(72) Inventors: Dong Hee Shin, Yongin-si (KR); Sunkwun Son, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 380 days.

(21) Appl. No.: 18/600,973

(22) Filed: Mar. 11, 2024

(65) Prior Publication Data

US 2024/0423040 A1 Dec. 19, 2024

(30) Foreign Application Priority Data

Jun. 15, 2023 (KR) ........................ 10-2023-0076525

(51) Int. Cl.

*H10K 59/40* (2023.01)
*H10K 39/34* (2023.01)
*H10K 59/131* (2023.01)

(52) U.S. Cl.

CPC ........... *H10K 59/131* (2023.02); *H10K 39/34* (2023.02); *H10K 59/40* (2023.02)

(58) Field of Classification Search

CPC .... H10K 39/34; H10K 59/126; H10K 59/131; H10K 59/40

See application file for complete search history.

(56) References Cited

U.S. PATENT DOCUMENTS

| | | | | |
|---|---|---|---|---|
| 11,075,252 B2 * | 7/2021 | Cha | G06V 40/1318 | |
| 11,640,785 B1 * | 5/2023 | Wu | G09G 3/3233 | 345/82 |
| 2013/0063407 A1 * | 3/2013 | Usukura | G06F 3/0412 | 345/207 |
| 2013/0113768 A1 * | 5/2013 | Yamamoto | G06F 3/042 | 345/207 |
| 2013/0120331 A1 * | 5/2013 | Yamamoto | G06F 3/042 | 345/207 |
| 2016/0092020 A1 * | 3/2016 | Azumi | G06F 3/04166 | 345/173 |
| 2021/0043692 A1 * | 2/2021 | Cha | G06V 40/1318 | |

* cited by examiner

*Primary Examiner* — Jaehwan Oh

(74) *Attorney, Agent, or Firm* — Womble Bond Dickinson (US) LLP

(57) ABSTRACT

A display device includes: a base layer in which a display area and a non-display area are defined; a circuit layer on the base layer; and an element layer on the circuit layer and including a light emitting element and a light receiving element corresponding to the display area, wherein the circuit layer includes: a pixel driving circuit connected to the light emitting element; a sensor driving circuit connected to the light receiving element; a read-out line connected to the sensor driving circuit; a data line connected to the pixel driving circuit; a driving voltage line connected to the pixel driving circuit; a reset voltage line connected to the sensor driving circuit; and a shielding electrode wiring electrically connected to the driving voltage line and overlapping the reset voltage line.

20 Claims, 18 Drawing Sheets

DISPLAY DEVICE

CROSS-REFERENCE TO RELATED APPLICATION

The present application claims priority to and the benefit of Korean Patent Application No. 10-2023-0076525, filed on Jun. 15, 2023, in the Korean Intellectual Property Office, the entire disclosure of which is incorporated herein by reference.

BACKGROUND

1. Field

Aspects of some embodiments of the present disclosure described herein relate to a display device having a reduced area of a non-display area.

2. Description of the Related Art

A display device provides various functions capable of organically communicating with a user, for example, of displaying an image to provide information to the user or detecting input of the user. Recent display devices also include a function for detecting biometric information of the user.

Examples of a biometric information recognition method include a capacitance method of detecting a change in a capacitance formed between electrodes, an optical method of detecting an input light beam using an optical sensor, an ultrasonic method of detecting vibration using a piezoelectric material, and the like.

The above information disclosed in this Background section is only for enhancement of understanding of the background and therefore the information discussed in this Background section does not necessarily constitute prior art.

SUMMARY

Aspects of some embodiments of the present disclosure include a display device having relatively improved circuit integration degree of a display panel having a biometric information recognition function.

According to some embodiments, a display device includes a base layer in which a display area and a non-display area are defined, a circuit layer on the base layer, and an element layer on the circuit layer and including a light emitting element and a light receiving element arranged to correspond to the display area.

According to some embodiments, the circuit layer may include a pixel driving circuit connected to the light emitting element, a sensor driving circuit connected to the light receiving element, a read-out line connected to the sensor driving circuit, a data line connected to the pixel driving circuit, a driving voltage line connected to the pixel driving circuit, a reset voltage line connected to the sensor driving circuit, and a shielding electrode wiring electrically connected to the driving voltage line and overlapping the reset voltage line.

According to some embodiments, a display device includes a base layer in which a display area and a non-display area are defined, a circuit layer on the base layer, and an element layer on the circuit layer and including a light emitting element and a light receiving element arranged to correspond to the display area.

According to some embodiments, the circuit layer may include a pixel driving circuit connected to the light emitting element, a sensor driving circuit connected to the light receiving element, a read-out line connected to the sensor driving circuit, a data line connected to the pixel driving circuit, a driving voltage line connected to the pixel driving circuit, and a shielding electrode wiring including a part between the data line and the read-out line in a plan view According to some embodiments, the read-out line may include a first line part on the same layer as that of the shielding electrode wiring, and a second line part intersecting the shielding electrode wiring in a plan view, on a different layer from that of the shielding electrode wiring, and connected to the first line part.

BRIEF DESCRIPTION OF THE DRAWINGS

The above and other aspects and features of the present disclosure will become more apparent by describing in more detail aspects of some embodiments thereof with reference to the accompanying drawings.

DETAILED DESCRIPTION

Figure 1:
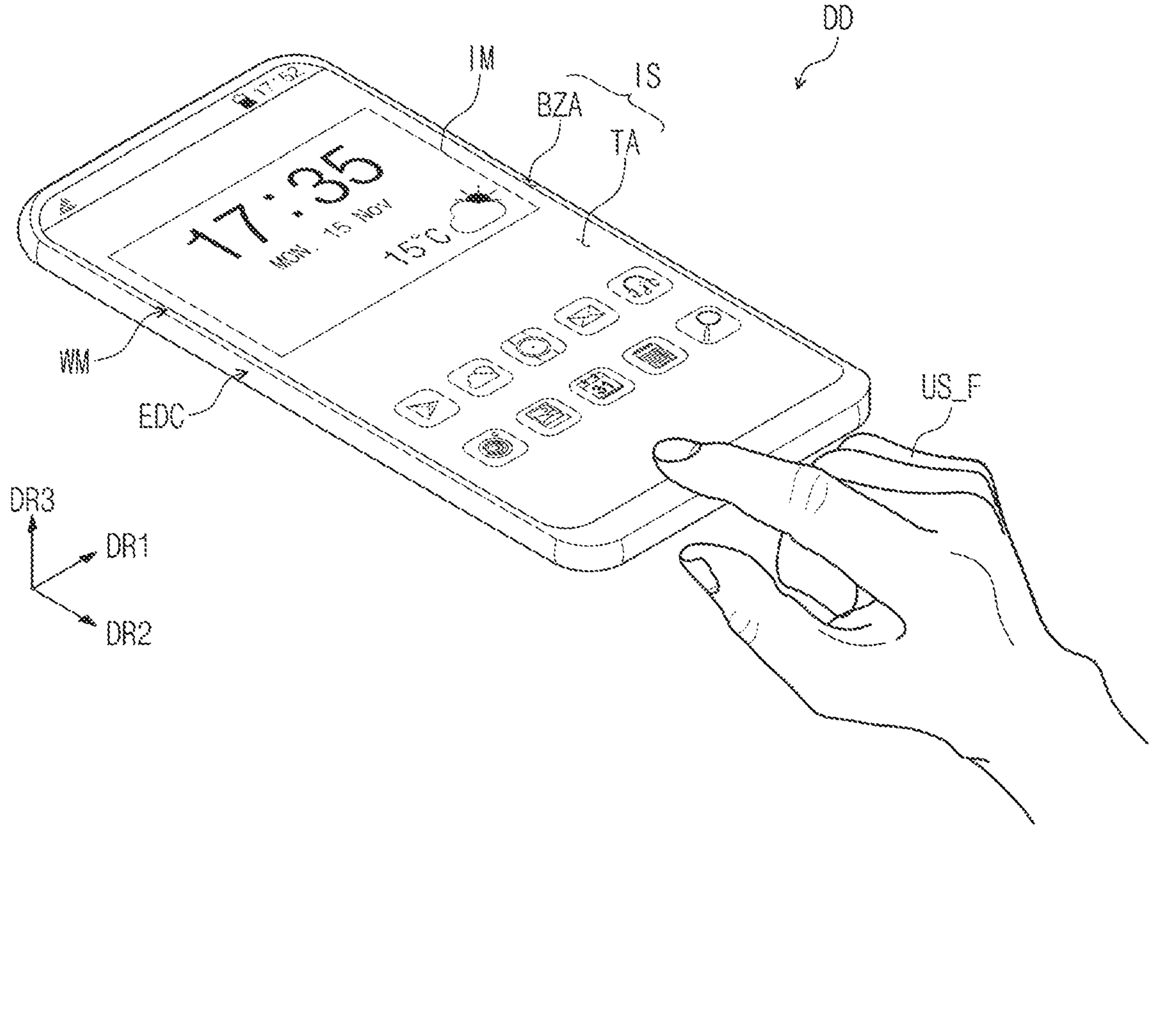
FIG. 1 is a perspective view of a display device according to some embodiments of the present disclosure.

In the present specification, the expression that a first component (or area, layer, part, portion, etc.) is "on", "connected with", or "coupled to" a second component means that the first component is directly on, connected with, or coupled to the second component or means that a third component is interposed therebetween.

The same reference numerals refer to the same components. Further, in the drawings, the thickness, the ratio, and the dimension of components are exaggerated for effective description of technical contents. The expression "and/or" includes one or more combinations which associated components are capable of defining.

Although the terms "first", "second", etc. may be used to describe various components, the components should not be limited by the terms. The terms are only used to distinguish one component from another component. For example, without departing from the right scope of the present disclosure, a first component may be referred to as a second component, and similarly, the second component may be also referred to as the first component. Singular expressions include plural expressions unless clearly otherwise indicated in the context.

Also, the terms "under", "below", "on", "above", etc. are used to describe the correlation of components illustrated in drawings. The terms that are relative in concept are described based on a direction illustrated in drawings.

It will be understood that the terms "include", "comprise", "have", etc. specify the presence of features, numbers, steps, operations, elements, or components, described in the specification, or a combination thereof, and do not exclude in advance the presence or additional possibility of one or more other features, numbers, steps, operations, elements, or components or a combination thereof.

Unless otherwise defined, all terms (including technical terms and scientific terms) used in the present specification have the same meaning as commonly understood by those skilled in the art to which the present disclosure belongs. Furthermore, terms such as terms defined in the dictionaries commonly used should be interpreted as having a meaning consistent with the meaning in the context of the related technology, and should not be interpreted in overly ideal or overly formal meanings unless explicitly defined herein.

Hereinafter, aspects of some embodiments of the present disclosure will be described in more detail with reference to accompanying drawings.

Figure 2A:
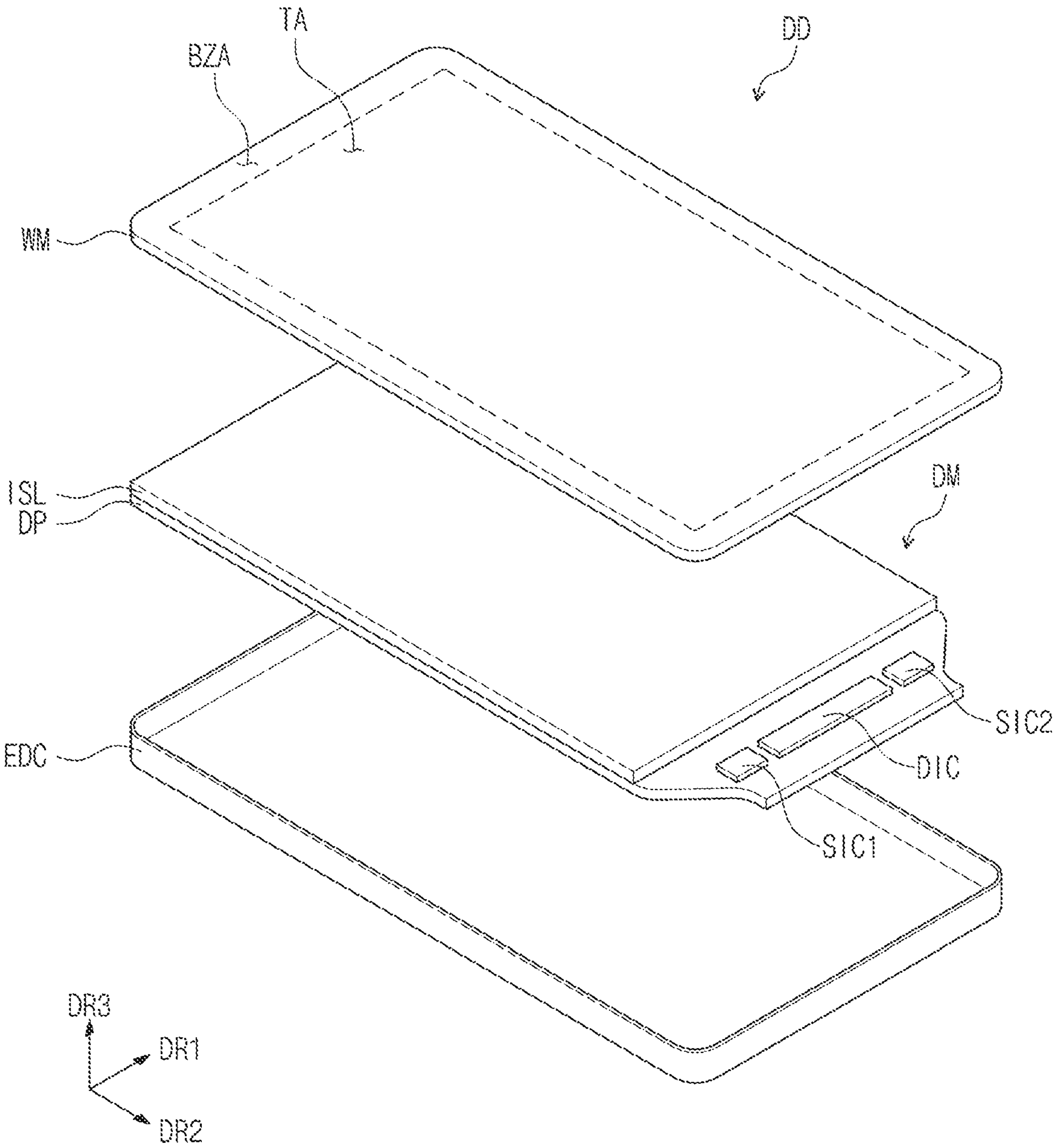
FIG. 2A is an exploded perspective view of the display device according to some embodiments of the present disclosure.
Figure 2B:
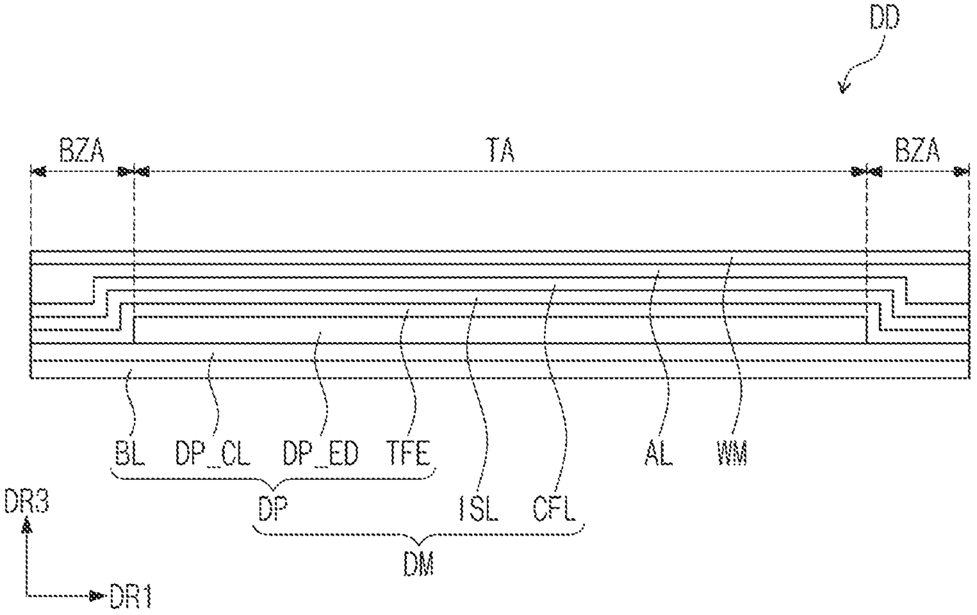
FIG. 2B is a cross-sectional view of the display device according to some embodiments of the present disclosure.

FIG. 1 is a perspective view of a display device according to some embodiments of the present disclosure, FIG. 2A is an exploded perspective view of the display device according to some embodiments of the present disclosure, and FIG. 2B is a cross-sectional view of the display device according to some embodiments of the present disclosure.

Referring to FIGS. 1, 2A, and 2B, a display device DD according to some embodiments of the present disclosure may have a rectangular shape having short sides parallel to a first direction DR1 and long sides parallel to a second direction DR2 intersecting the first direction DR1. However, embodiments according to the present disclosure are not particularly limited thereto, and the display device DD may have various shapes such as a circular shape and polygonal shapes.

The display device DD may be a device that is activated according to an electric signal. The display device DD may be applied to various electronic devices such as a smart watch, a tablet, a laptop, a computer, and a smart television.

Hereinafter, a normal direction substantially perpendicular to a plane defined by the first direction DR1 and the second direction DR2 is defined as a third direction DR3. In the present specification, the wording "when viewed in a plan view" means a state viewed from the third direction DR3.

An upper surface of the display device DD may be defined as a display surface IS and may be parallel to the plane defined by the first direction DR1 and the second direction DR2. Images IM generated in the display device DD may be provided to a user through the display surface IS.

The display surface IS may be divided into a transmissive area TA and a bezel area BZA. The transmissive area TA may be an area on which the images IM are displayed. The user visually recognizes the images IM through the transmissive area TA. According to some embodiments, the transmissive area TA has a quadrangular shape having rounded vertexes. However, this is merely illustrated as an example, the transmissive area TA may have various shapes, and embodiments according to the present disclosure are not limited thereto.

The bezel area BZA is adjacent to the transmissive area TA. The bezel area BZA may have a color (e.g., a set or predetermined color). The bezel area BZA may surround the transmissive area TA. Accordingly, a shape of the transmissive area TA may be substantially defined by the bezel area BZA. However, this is illustrated as an example, and the bezel area BZA may be located adjacent to only one side of the transmissive area TA or may be omitted.

The display device DD may detect an external input applied from the outside. The external input may include various types of inputs provided from the outside of the display device DD. For example, the external input may include a contact by a part of a body of a user such as a hand US_F and a contact by a separate device (for example, an active pen, a digitizer, or the like) as well as an external input (for example, hovering) applied close to the display device DD or adjacent to the display device DD at a distance (e.g., a set or predetermined distance). Further, the external input may have various forms such as a force, a pressure, a temperature, and a light beam.

The display device DD may detect biometric information of the user, which is applied from the outside. A biometric information detection area in which the biometric information of the user may be detected may be provided to the display surface IS of the display device DD. The biometric information detection area may be provided to the entire area of the transmissive area TA or provided to a partial area of the transmissive area TA. FIG. 1 illustrates that the entire transmissive area TA is utilized as the biometric information detection area as an example of the present disclosure.

The display device DD may include a window WM, a display module DM, and a housing EDC. According to some embodiments, the window WM and the housing EDC are coupled to each other to constitute an exterior appearance of the display device DD.

A front surface of the window WM defines the display surface IS of the display device DD. The window WM may include an optically transparent insulating material. For example, the window WM may include a glass or plastic. The window WM may have a multi-layer structure or a single-layer structure. For example, the window WM may include a plurality of plastic films coupled through an adhesive or include a glass substrate and a plastic substrate coupled through an adhesive.

The display module DM may include a display panel DP and an input detection layer ISL. The display panel DP may display an image according to an electric signal, and the input detection layer ISL may detect an electric input applied from the outside. The external input may be provided in various forms.

The display panel DP according to some embodiments of the present disclosure may be a light emitting display panel, but embodiments according to the present disclosure are not particularly limited thereto. For example, the display panel DP may be an organic light emitting display panel, an inorganic light emitting display panel, or a quantum dot light emitting display panel. A light emitting layer of the organic light emitting display panel may include an organic light emitting material, and a light emitting layer of the inorganic light emitting display panel may include an inorganic light emitting material. A light emitting layer of the quantum dot light emitting display panel may include a quantum dot, a quantum rod, or the like. Hereinafter, the display panel DP will be described as the organic light emitting display panel.

Referring to FIG. 2B, the display panel DP may include a base layer BL, a circuit layer DP_CL, an element layer DP_ED, and an encapsulation layer TFE. The display panel DP according to the present disclosure may be a flexible display panel. However, embodiments according to the present disclosure are not particularly limited thereto. For example, the display panel DP may be a foldable display panel that is folded with respect to a folding axis or a rigid display panel.

The base layer BL may include a synthetic resin layer. The synthetic resin layer may be a polyimide-based resin layer, and a material thereof is not particularly limited thereto. In addition, the base layer BL may include a glass substrate, a metal substrate, an organic/inorganic composite material substrate, or the like.

The circuit layer DP_CL is located on the base layer BL. The circuit layer DP_CL is located between the base layer BL and the element layer DP_ED. The circuit layer DP_CL includes at least one insulating layer and at least one circuit element. Hereinafter, the insulating layer included in the circuit layer DP_CL is referred to as an intermediate insulating layer. The intermediate insulating layer includes at least one intermediate inorganic film and at least one intermediate organic film. The circuit element may include a pixel driving circuit included in each of a plurality of pixels for displaying images, a sensor driving circuit included in each of a plurality of sensors for recognizing external information, and the like. The external information may be biometric information. As an example of the present disclosure, the sensor may be a fingerprint recognition sensor, a proximity sensor, an iris recognition sensor, a blood pressure measuring sensor, an illumination sensor, or the like. Further, the sensor may be an optical sensor that recognizes biometric information in an optical manner. The circuit layer DP_CL may further include signal lines connected to the pixel driving circuit and/or a sensor driving circuit.

The element layer DP-ED may include a light emitting element included in each of the pixels and a light receiving element included in each of the sensors. As an example of the present disclosure, the light receiving element may be a photodiode. The light receiving element may be a sensor that detects a light beam reflected by a fingerprint of a user or responds to the light beam. The circuit layer DP_CL and the element layer DP_ED will be described below in detail with reference to FIGS. 6 to 12B.

The encapsulation layer TFE seals the element layer DP_ED. The encapsulation layer TFE may include at least one organic film and at least one inorganic film. The inorganic film may include an inorganic material and protect the element layer DP_ED from moisture/oxygen. The inorganic film may include a silicon nitride layer, a silicon oxy nitride layer, a silicon oxide layer, a titanium oxide layer, an aluminum oxide layer, or the like, but embodiments according to the present disclosure are not particularly limited thereto. The organic layer may include an organic material and protect the element layer DP_ED from foreign substances such as dust particles.

The input detection layer ISL may be formed on the display panel DP. The input detection layer ISL may be directly located on the encapsulation layer TFE. According to some embodiments of the present disclosure, the input detection layer ISL may be formed on the display panel DP by a subsequent process. That is, when the input detection layer ISL is directly located on the display panel DP, an adhesive film is not located between the input detection layer ISL and the encapsulation layer TFE. Alternatively, an adhesive film may be located between the input detection layer ISL and the display panel DP. In this case, the input detection layer ISL is not manufactured by a continuous process together with the display panel DP, may be manufactured through a separate process from the display panel DP, and may be then fixed to an upper surface of the display panel DP by the adhesive film.

The input detection layer ISL may detect the external input (for example, a touch of the user), change the detected external input into an input signal (e.g., a set or predetermined input signal), and provide the input signal to the display panel DP. The input detection layer ISL may include a plurality of detection electrodes for detecting the external input. The detection electrodes may detect the external input in a capacitive manner. The display panel DP may receive the input signal from the input detection layer ISL and generate an image corresponding to the input signal.

The display module DM may further include a color filter layer CFL. As an example of the present disclosure, the color filter layer CFL may be located on the input detection layer ISL. However, embodiments according to the present disclosure are not particularly limited thereto. The color filter layer CFL may be located between the display panel DP and the input detection layer ISL. The color filter layer CFL may include a plurality of color filters and a black matrix.

A structure of the input detection layer ISL and the color filter layer CFL will be described below in detail.

The display device DD according to some embodiments of the present disclosure may further include an adhesive layer AL. The window WM may be attached to the input detection layer ISL by the adhesive layer AL. The adhesive layer AL may include an optical clear adhesive, an optically clear adhesive resin, or a pressure-sensitive adhesive (PSA).

The display module DM may further include a driving chip DIC and sensor chips SIC1 and SIC2. As an example of the present disclosure, the driving chip DIC and the sensor chips SIC1 and SIC2 may be mounted on the display panel DP. The driving chip DIC and the sensor chips SIC1 and SIC2 may be arranged adjacent to one end (hereinafter, a first end) of the display panel DP. FIG. 2A illustrates a structure in which the driving chip DIC and the sensor chips SIC1 and SIC2 are arranged adjacent to the first end of the display panel DP, but embodiments according to the present disclosure are not particularly limited thereto. For example, the driving chip DIC may be located adjacent to the first end of the display panel DP, and the sensor chips SIC1 and SIC2 may be arranged adjacent to a second end of the display panel DP, which is opposite to the first end.

As an example of the present disclosure, the sensor chips SIC1 and SIC2 may include the first sensor chip SIC1 located on one side (hereinafter, a first side) of the driving chip DIC and the second sensor chip SIC2 located on a second side of the driving chip DIC, which is different from the first side. However, alternatively, the first and second sensor chips SIC1 and SIC2 may be integrated into one chip, and the integrated chip may be located on the one side of the driving chip DIC or only one of the first and second sensor chips SIC1 and SIC2 may be located on the one side of the driving chip DIC. According to embodiments of the present disclosure, the number of sensor chips SIC1 and SIC2 and the number of driving chips DIC are not particularly limited. For example, according to some embodiments there may be additional sensor chips or fewer sensor chips without departing from the spirit and scope of embodiments according to the present disclosure.

The housing EDC is coupled to the window WM. The housing EDC is coupled to the window WM to provide an inner space (e.g., a set or predetermined inner space). The display module DM may be accommodated in the inner space. The housing EDC may include a material having a relatively high rigidity. For example, the housing EDC may include a plurality of frames and/or plates made of a glass, a plastic, or a metal or combinations thereof. The housing EDC may stably protect components of the display device DD accommodated in the inner space from an external impact. According to some embodiments, a battery module or the like for supplying power required for overall operation of the display device DD may be located between the display module DM and the housing EDC.

Figure 3:
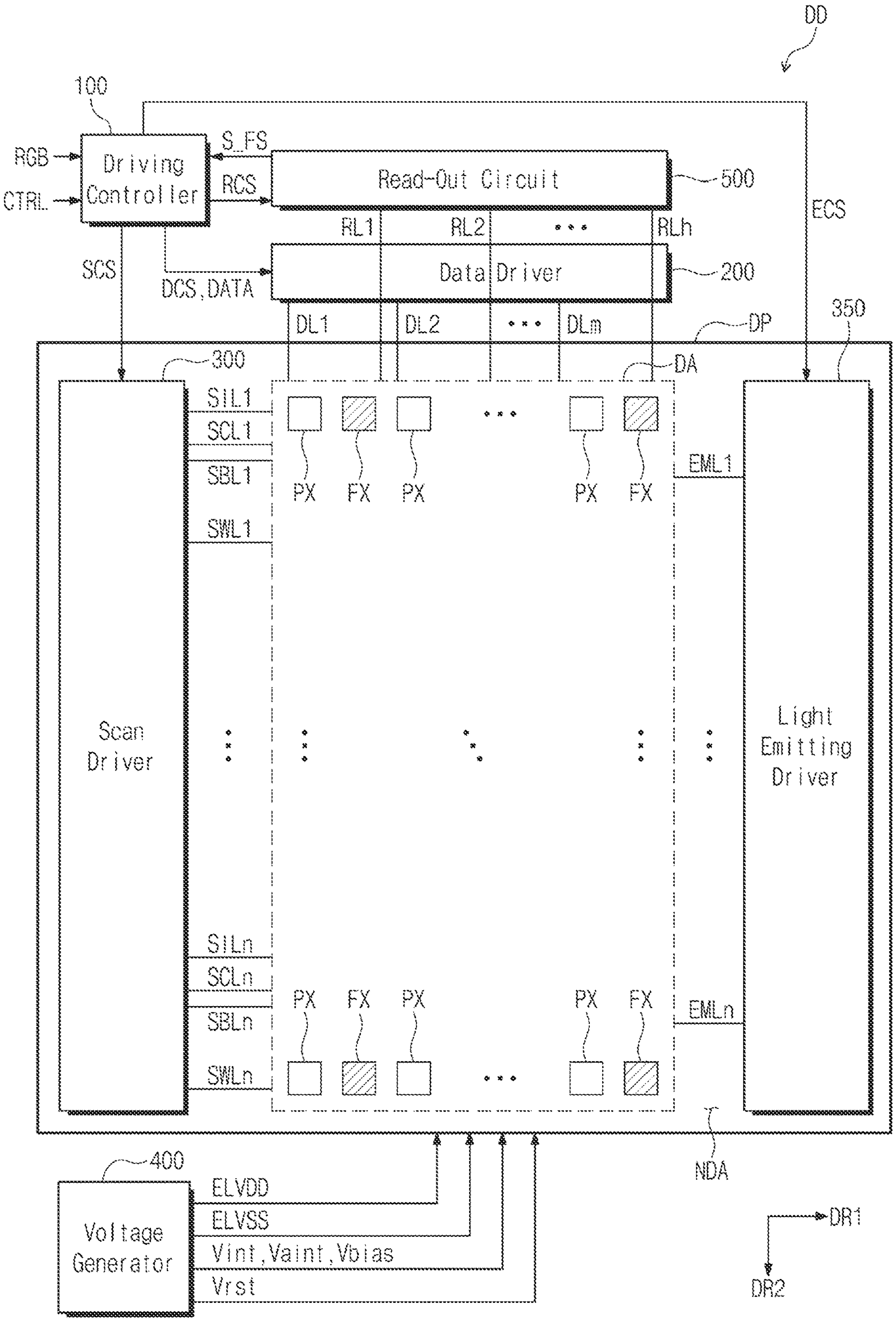
FIG. 3 is a block diagram of the display device according to some embodiments of the present disclosure.

FIG. 3 is a block diagram of a display device according to some embodiments of the present disclosure.

Referring to FIG. 3, the display device DD includes the display panel DP, a panel driver, and a driving controller 100. As an example of the present disclosure, the panel driver includes a data driver 200, a scan driver 300, a light emitting driver 350, a voltage generator 400, and a read-out circuit 500.

The driving controller 100 receives an image signal RGB and a control signal CTRL. The driving controller 100 generates image data DATA obtained by converting a data format of the image signal RGB to meet an interface specification with the data driver 200. The driving controller 100 outputs a first control signal SCS, a second control signal ECS, a third control signal DCS, and a fourth control signal RCS.

The data driver 200 may receive the third control signal DCS and the image data DATA from the driving controller 100. The data driver 200 converts the image data DATA into data signals and outputs the data signals to a plurality of data lines DL1 to DLm, which will be described below. The data signals are analog voltages corresponding to grayscale values of the image data DATA. As an example of the present disclosure, the data driver 200 may be embedded in the driving chip DIC illustrated in FIG. 2A.

The scan driver 300 receives the first control signal SCS from the driving controller 100. The scan driver 300 may output scan signals to scan lines in response to the first control signal SCS.

The voltage generator 400 generates voltages required for operating the display panel DP. According to some embodiments, the voltage generator 400 generates a first driving voltage ELVDD, a second driving voltage ELVSS, a first initialization voltage Vint, a second initialization voltage Vaint, a bias voltage Vbias, and a reset voltage Vrst.

The display panel DP may include a display area DA corresponding to the transmissive area TA (illustrated in FIG. 1) and a non-display area NDA corresponding to the bezel area BZA (illustrated in FIG. 1).

The display panel DP may include a plurality of pixels PX arranged in the display area DA and a plurality of sensors FX arranged in the display area DA. As an example of the present disclosure, each of the plurality of sensors FX may be located between two pixels PX. The plurality of pixels PX and the plurality of sensors FX may be alternately arranged in the first and second directions DR1 and DR2. However, embodiments according to the present disclosure are not particularly limited thereto. That is, two or more pixels PX may be arranged between two sensors FX adjacent to each other in the first direction DR1 among the plurality of sensors FX or two or more pixels PX may be arranged between two sensors FX adjacent to each other in the second direction DR2 among the plurality of sensors FX.

The display panel DP further includes initialization scan lines SIL1 to SILn, compensation scan lines SCL1 to SCLn, writing scan lines SWL1 to SWLn, black scan lines SBL1 to SBLn, light emitting control lines EML1 to EMLn, the data lines DL1 to DLm, and read-out lines RL1 to RLh. The initialization scan lines SIL1 to SILn, the compensation scan lines SCL1 to SCLn, the writing scan lines SWL1 to SWLn, the black scan lines SBL1 to SBLn, and the light emitting control lines EML1 to EMLn extend in the first direction DR1. The initialization scan lines SIL1 to SILn, the compensation scan lines SCL1 to SCLn, the writing scan lines SWL1 to SWLn, the black scan lines SBL1 to SBLn, and the light emitting control lines EML1 to EMLn are arranged spaced apart from each other in the second direction DR2. The data lines DL1 to DLm and the read-out lines RL1 to RLh extend in the second direction DR2 and are spaced apart from each other in the first direction DR1. Here, "n", "m", and "h" are natural numbers greater than or equal to 1.

The plurality of pixels PX are electrically connected to the initialization scan lines SIL1 to SILn, the compensation scan lines SCL1 to SCLn, the writing scan lines SWL1 to SWLn, the black scan lines SBL1 to SBLn, the light emitting control lines EML1 to EMLn, and the data lines DL1 to DLm. For example, each of the plurality of pixels PX may be electrically connected to four scan lines. However, the number of scan lines connected to each pixel PX is not limited thereto and may be changed.

The plurality of sensors FX are electrically connected to the writing scan lines SWL1 to SWLn and the read-out lines RL1 to RLh. Each of the plurality of sensors FX may be electrically connected to one scan line. However, embodiments according to the present disclosure are not particularly limited thereto. The number of scan lines connected to each sensor FX may change. As an example of the present disclosure, the number of read-out lines RL1 to RLh may be smaller than or equal to the number of data lines DL1 to DLm. For example, the number of read-out lines RL1 to RLh may correspond to a half, a quarter, or an eighth of the number of data lines DL1 to DLm.

The scan driver 300 may be located in the non-display area NDA of the display panel DP. The scan driver 300 receives the first control signal SCS from the driving controller 100. The scan driver 300 outputs initialization scan signals to the initialization scan lines SIL1 to SILn and outputs compensation scan signals to the compensation scan lines SCL1 to SCLn in response to the first control signal SCS. Further, the scan driver 300 may output writing scan signals to the writing scan lines SWL1 to SWLn and output black scan signals to the black scan lines SBL1 to SBLn in response to the first control signal SCS. Alternatively, the scan driver 300 may include first and second scan drivers. The first scan driver may output the initialization scan signals and the compensation scan signals, and the second scan driver may output the writing scan signals and the black scan signals.

The light emitting driver 350 may be located in the non-display area NDA of the display panel DP. The light emitting driver 350 receives the second control signal ECS from the driving controller 100. The light emitting driver 350 may output light emitting control signals to the light emitting control lines EML1 to EMLn in response to the second control signal ECS. Alternatively, the scan driver 300 may be connected to the light emitting control lines EML1 to EMLn. In this case, the light emitting driver 350 may be omitted, and the scan driver 300 may output the light emitting control signals to the light emitting control lines EML1 to EMLn.

The read-out circuit 500 may receive the fourth control signal RCS from the driving controller 100. The read-out circuit 500 may receive detection signals from the read-out lines RL1 to RLh in response to the fourth control signal RCS. The read-out circuit 500 may process the detection signals received from the read-out lines RL1 to RLh and provide the processed detection signals S_FS to the driving controller 100. The driving controller 100 may recognize biometric information on the basis of the detection signals S_FS. As an example of the present disclosure, the read-out circuit 500 may be embedded in the sensor chips SIC1 and SIC2 illustrated in FIG. 2A.

Figure 4A:
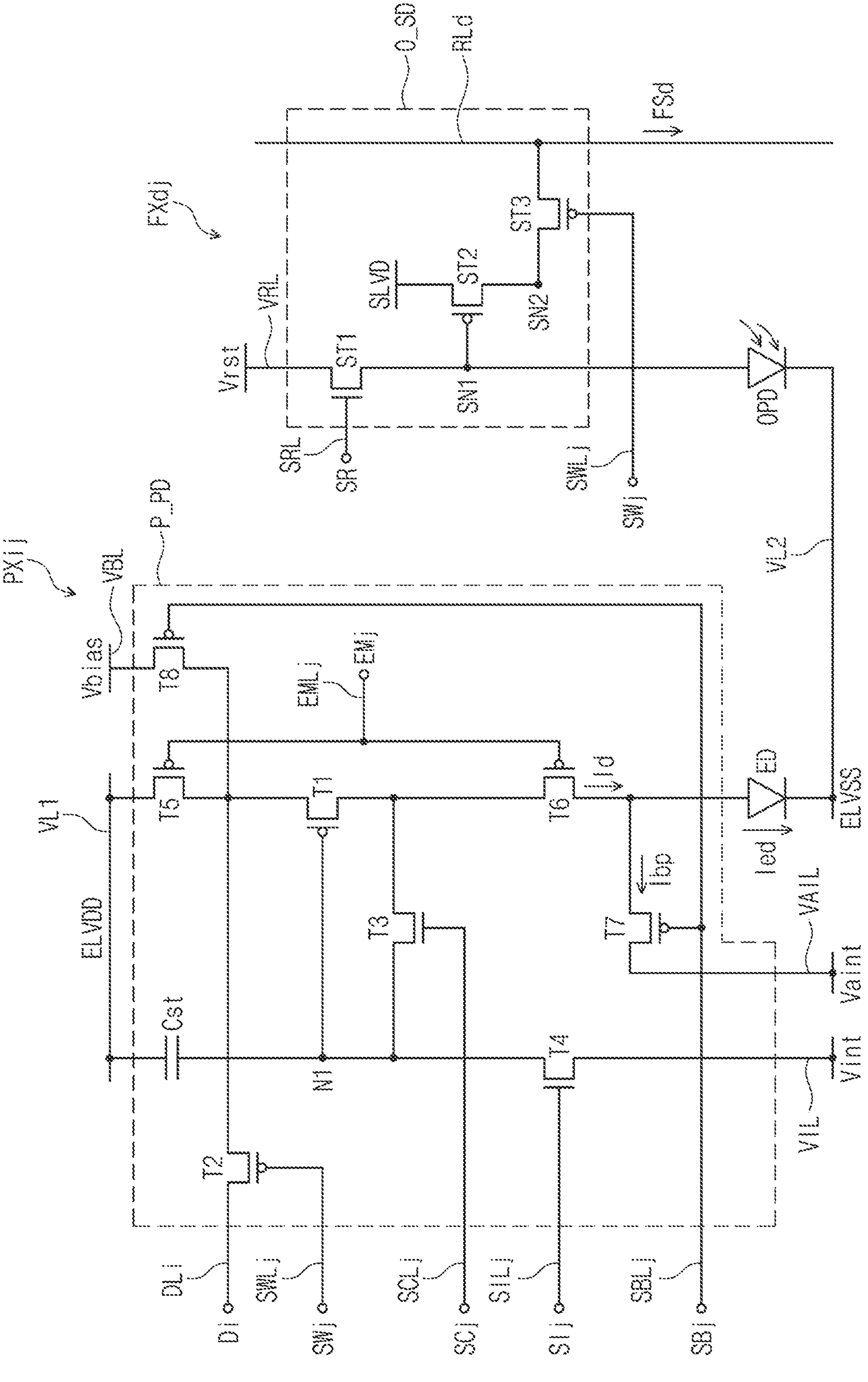
FIG. 4A is a circuit diagram illustrating pixels and sensors according to some embodiments of the present disclosure.
Figure 4B:
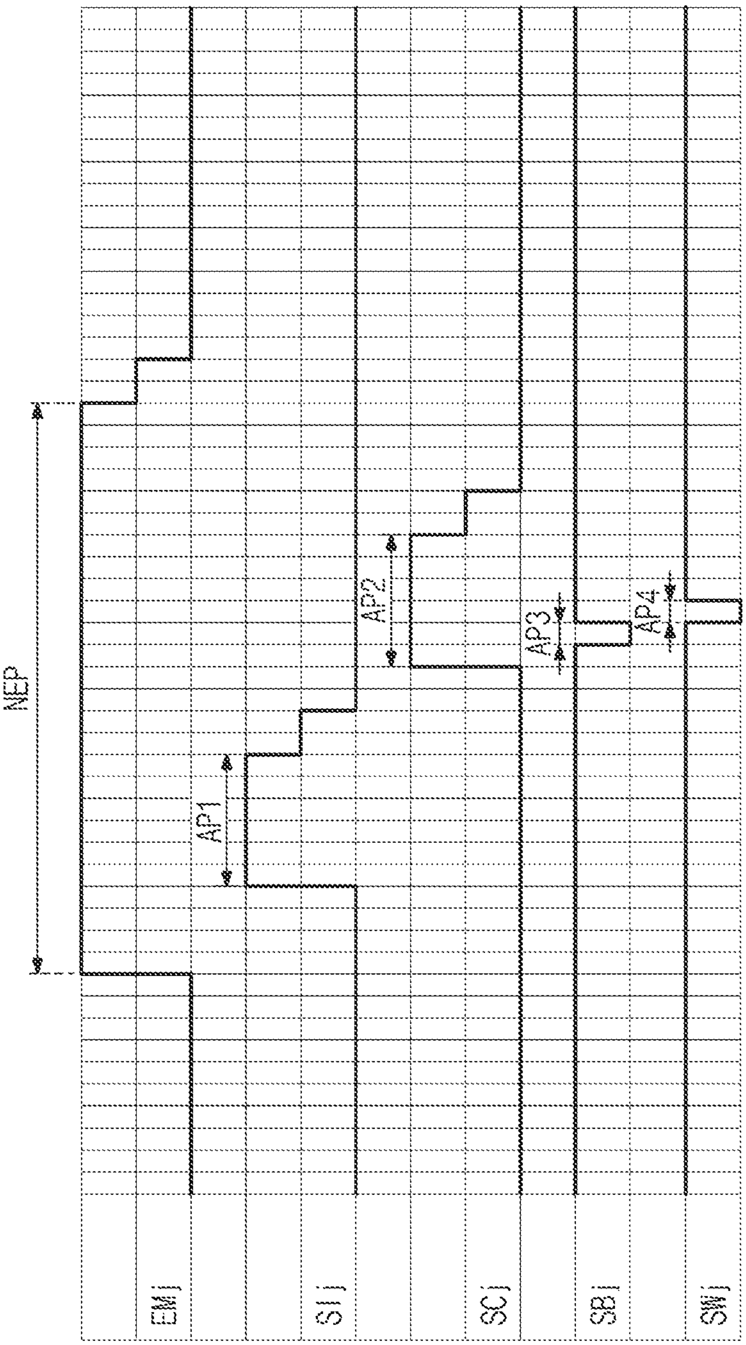
FIG. 4B is a waveform diagram for describing operations of the pixels and the sensors illustrated in FIG. 4A.

FIG. 4A is a circuit diagram illustrating pixels and sensors according to some embodiments of the present disclosure, and FIG. 4B is a waveform diagram for describing operations of the pixels and the sensors illustrated in FIG. 4A.

FIG. 4A is an equivalent circuit diagram of one pixel PXij among the plurality of pixels PX illustrated in FIG. 3. Because the plurality of pixels PX have the same circuit structure, only a circuit structure of the pixel PXij will be described, and a detailed description of the other pixels will be omitted. Further, FIG. 4A is an equivalent circuit diagram of one sensor FXdj among the plurality of sensors FX illustrated in FIG. 3. Because the plurality of sensors FX have the same circuit structure, only a circuit structure of the sensor FXdj will be described, and a detailed description of the other pixels will be omitted.

Referring to FIG. 4A, the pixel PXij is connected to an $i^{th}$ data line DLi among the data lines DL1 to DLm, a $j^{th}$ initialization scan line SILj among the initialization scan lines SIL1 to SILn, a $j^{th}$ compensation scan line SCLj among the compensation scan lines SCL1 to SCLn, a $j^{th}$ writing scan line SWLj among the writing scan lines SWL1 to SWLn, a $j^{th}$ black scan line SBLj among the black scan lines SBL1 to SBLn, and a $j^{th}$ light emitting control line EMLj among the light emitting control lines EML1 to EMLn.

The pixel PXij includes a light emitting element ED and a pixel driving circuit P_PD. The light emitting element ED may be a light emitting diode. As an example of the present disclosure, the light emitting element ED may be an organic light emitting diode including an organic light emitting layer.

The pixel driving circuit P_PD includes first to eighth transistors T1, T2, T3, T4, T5, T6, T7, and T8 and one capacitor Cst. At least one of the first to eighth transistors T1 to T8 may be a transistor having a low-temperature polycrystalline silicon (LTPS) semiconductor layer. Some of the first to eighth transistors T1 to T8 may be P-type transistors, and the others thereof may be N-type transistors. At least one of the first to eighth transistors T1 to T8 may be a transistor having an oxide semiconductor layer. For example, the third and fourth transistors T3 and T4 may be oxide semiconductor transistors, and the first, second, fifth to eighth transistors T1, T2, and T5 to T8 may be LTPS transistors. The third and fourth transistors T3 and T4 may be N-channel metal oxide semiconductor (NMOS) transistors.

A configuration of the pixel driving circuit P_PD according to embodiments of the present disclosure is not limited to the embodiments illustrated with respect to FIG. 4A. The pixel driving circuit P_PD illustrated in FIG. 4A is merely an example, and the configuration of the pixel driving circuit P_PD may be modified and implemented. For example, all of the first, second, and fifth to eighth transistors T1, T2, and T5 to T8 may be P-type transistors or N-type transistors.

The $j^{th}$ initialization scan line SILj, the $j^{th}$ compensation scan line SCLj, the $j^{th}$ writing scan line SWLj, the $j^{th}$ black scan line SBLj, and the $j^{th}$ light emitting control line EMLj may transmit, to the pixel PXij, a $j^{th}$ initialization scan signal SIj, a $j^{th}$ compensation scan signal SCj, a $j^{th}$ writing scan signal SWj, a $j^{th}$ black scan signal SBj, and a $j^{th}$ light emitting control signal EMj, respectively. The $i^{th}$ data line DLi transmits an $i^{th}$ data signal Di to the pixel PXij. The $i^{th}$ data signal Di may have a voltage level corresponding to the image signal RGB (see FIG. 3) input to the display device DD (see FIG. 3).

As an example of the present disclosure, the pixel PXij may be connected to first and second driving voltage lines VL1 and VL2, first and second initialization voltage lines VIL and VAIL, and a bias voltage line VBL. The first driving voltage line VL1 may transmit the first driving voltage EVLDD to the pixel PXij, and the second driving voltage line VL2 may transmit the second driving voltage ELVSS to the pixel PXij. Further, the first initialization voltage line VIL may transmit the first initialization voltage Vint to the pixel PXij, and the second initialization voltage line VAIL may transmit the second initialization voltage Vaint to the pixel PXij. The bias voltage line VBL may transmit the bias voltage Vbias to the pixel PXij.

The first transistor T1 is connected between the first driving voltage line VL1 that receives the first driving voltage ELVDD and the light emitting element ED. The first transistor T1 includes a first electrode connected to the first driving voltage line VL1 via the fifth transistor T5, a second electrode connected to an anode electrode of the light emitting element ED via the sixth transistor T6, and a third electrode (for example, a gate electrode) connected to one end (for example, a first node N1) of the capacitor Cst. The first transistor T1 may receive the $i^{th}$ data signal Di transmitted by the $i^{th}$ data line DLi according to a switching operation of the second transistor T2 and supply a driving current Id to the light emitting element ED.

The second transistor T2 is connected between the data line DLi and the first electrode of the first transistor T1. The second transistor T2 includes a first electrode connected to the data line DLi, a second electrode connected to the first electrode of the first transistor T1, and a third electrode (for example, a gate electrode) connected to the $j^{th}$ writing scan line SWLj. The second transistor T2 may be turned on according to the writing scan signal SWj transmitted through the $j^{th}$ writing scan line SWLj and may transmit the $i^{th}$ data signal Di transmitted from the $i^{th}$ data line DLi to the first electrode of the first transistor T1.

The third transistor T3 is connected between the second electrode of the first transistor T1 and the first node N1. The third transistor T3 includes a first electrode connected to the third electrode of the first transistor T1, a second electrode connected to the second electrode of the first transistor T1, and a third electrode (for example, a gate electrode) connected to the $j^{th}$ compensation scan line SCLj. The third transistor T3 may be turned on according to the $j^{th}$ compensation scan signal SCj transmitted through the $j^{th}$ compensation scan line SCLj, may connect the third electrode and the second electrode of the first transistor T1 to each other, and thus may diode-connect the first transistor T1.

The fourth transistor T4 is connected between the first initialization voltage line VIL to which the first initialization voltage Vint is applied and the first node N1. The fourth transistor T4 includes a first electrode connected to the first initialization voltage line VIL to which the first initialization voltage Vint is transmitted, a second electrode connected to the first node N1, and a third electrode (for example, a gate electrode) connected to the $j^{th}$ initialization scan line SILj. The fourth transistor T4 is turned on according to the $j^{th}$ initialization scan signal SIj transmitted through the $j^{th}$ initialization scan line SILj. The turned-on fourth transistor T4 transmits the first initialization voltage Vint to the first node N1 and initializes a potential of the third electrode of the first transistor T1 (that is, a potential of the first node N1).

The fifth transistor T5 includes a first electrode connected to the first driving voltage line VL1, a second electrode connected to the first electrode of the first transistor T1, and a third electrode (for example, a gate electrode) connected to the $j^{th}$ light emitting control line EMLj.

The third transistor T6 includes a first electrode connected to the second electrode of the first transistor T1, a second electrode connected to the anode electrode of the light emitting element ED, and a third electrode (for example, a gate electrode) connected to the $j^{th}$ light emitting control line EMLj.

The fifth and sixth transistor T5 and T6 are simultaneously turned on according to the $j^{th}$ light emitting control signal EMj transmitted through the $j^{th}$ light emitting control line EMLj. The first driving voltage ELVDD applied through the turned-on fifth transistor T5 may be compensated for through the diode-connected first transistor T1 and then may be transmitted to the light emitting element ED.

The seventh transistor T7 includes a first electrode connected to the second initialization voltage line VAIL to which the second initialization voltage Vaint is transmitted, a second electrode connected to the second electrode of the sixth transistor T6, and a third electrode (for example, a gate electrode) connected to the $j^{th}$ black scan line SBLj. The second initialization voltage Vaint may have a voltage level lower than or equal to the first initialization voltage Vint.

The eighth transistor T8 includes a first electrode connected to the bias voltage line VBL to which the bias voltage Vbias is transmitted, a second electrode connected to the first electrode of the first transistor T1, and a third electrode (for example, a gate electrode) connected to the $j^{th}$ black scan line SBLj.

The seventh and eighth transistors T7 and T8 are simultaneously turned on according to the $j^{th}$ black scan signal SBj transmitted through the $j^{th}$ black scan line SBLj. The second initialization voltage Vaint applied through the turned-on seventh transistor T7 may be transmitted to the anode electrode of the light emitting element ED. Thus, the anode electrode of the light emitting element ED may be initialized by the second initialization voltage Vaint. The bias voltage Vbias applied through the turned-on eighth transistor T8 may be transmitted to the first electrode of the first transistor T1. Thus, the bias voltage Vbias may be periodically applied to the first electrode of the first transistor T1. As a result, degradation of display quality caused as a potential difference between the first and second electrodes of the first transistor T1 increases to a level (e.g., a set or predetermined level) or more due to a hysteresis phenomenon may be prevented or reduced.

As described above, one end of the capacitor Cst is connected to the third electrode of the first transistor T1, and the other end thereof is connected to the first driving voltage line VL1. A cathode electrode of the light emitting element ED may be connected to the second driving voltage line VL2 that transmits the second driving voltage ELVSS. The second driving voltage ELVSS may have a voltage level lower than that of the first driving voltage ELVDD. As an example of the present disclosure, the second driving voltage ELVSS may have a voltage level lower than those of the first and second initialization voltages Vint and Vaint.

Referring to FIGS. 4A and 4B, the $j^{th}$ light emitting control signal EMj has a high level during a non-emission period NEP. In the non-emission period NEP, the $j^{th}$ initialization scan signal SIj is activated. When the $j^{th}$ initialization scan signal SIj having a high level is provided through the $j^{th}$ initialization scan line SILj during an activation period AP1 (hereinafter, referred to as a first activation period) of the $j^{th}$ initialization scan signal SIj, the fourth transistor T4 is turned on in response to the $j^{th}$ initialization scan signal SIj having the high level. The first initialization voltage Vint is transmitted to the third electrode of the first transistor T1 through the turned-on fourth transistor T4, and the first node N1 is initialized through the first initialization voltage Vint. Thus, the first activation period AP1 may be defined as a period in which the pixel PXij is initialized.

Next, when the $j^{th}$ compensation scan signal SCj is activated, and when the $j^{th}$ compensation scan signal SCj having a high level is supplied through the $j^{th}$ compensation scan line SCLj during an activation period AP2 (hereinafter, referred to as a second activation period) of the $j^{th}$ compensation scan signal SCj, the third transistor T3 is turned on. The first transistor T1 is diode-connected by the turned-on third transistor T3 and is biased forward. The first activation period AP1 may not overlap the second activation period AP2.

The $j^{th}$ writing scan signal SWj is activated inside the second activation period AP2. The $j^{th}$ writing scan signal SWj has a low level during an activation period AP4 (hereinafter, referred to as a fourth activation period). During the fourth activation period AP4, the second transistor T2 is turned on by the $j^{th}$ writing scan signal SWj having a low level. Then, a compensation voltage Di-Vth decreased by a threshold voltage Vth of the first transistor T1 from the $i^{th}$ data signal Di supplied from the $i^{th}$ data line DLi is applied to the third electrode of the first transistor T1. That is, the potential of the third electrode of the first transistor T1 may be the compensation voltage Di-Vth. The fourth activation period AP4 may overlap the second activation period AP2. A duration of the second activation period AP2 may be greater than a duration of the fourth activation period AP4.

The first driving voltage ELVDD and the compensation voltage Di-Vth may be applied to both ends of the capacitor Cst, and charges corresponding to a voltage between both ends may be stored in the capacitor Cst. Here, a high level period of the $j^{th}$ compensation scan signal SCj may be referred to as a compensation period of the pixel PXij.

Meanwhile, the $j^{th}$ black scan signal SBj is activated in the second activation period AP2 of the $j^{th}$ compensation scan signal SCj. The $j^{th}$ black scan signal SBj has a low level during an activation period AP3 (hereinafter, referred to as a third activation period). During the third activation period AP3, the seventh transistor T7 is turned on by receiving the $j^{th}$ black scan signal SBj having a low level through the $j^{th}$ black scan line SBLj. By the seventh transistor T7, a portion of the driving current Id, which is a bypass current Ibp, may escape through the seventh transistor T7. The third activation period AP3 may overlap the second activation period AP2. The duration of the second activation period AP2 may be greater than a duration of the third activation period AP3. The third activation period AP3 may precede the fourth activation period AP4 and may not overlap the fourth activation period AP4.

When the pixel PXij displays a black image, even when a minimum driving current of the first transistor T1 flows as the driving current Id, when the light emitting element ED emits a light beam, the pixel PXij cannot normally display the black image. Thus, the seventh transistor T7 inside the pixel PXij according to some embodiments of the present disclosure may disperse a portion of the minimum driving current of the first transistor T1, which is the bypass current Ibp, to a current path other than a current path toward the light emitting element ED. Here, the minimum driving current of the first transistor T1 refers to a current flowing to the first transistor T1 under a condition in which a gate-source voltage Vgs of the first transistor T1 is smaller than the threshold voltage Vth and thus the first transistor T1 is turned off. In this way, under the condition in which the first transistor T1 is turned off, the minimum driving current (for example, a current of 10 pA or less) flowing to the first transistor T1 is transferred to the light emitting element ED, and a black grayscale image is displayed. When the pixel PXij displays a black image, an effect of the bypass current Ibp on the minimum driving current is relatively large. However, when the pixel PXij displays an image such as a normal image or a white image, there is almost no effect of the bypass current Ibp on the driving current Id. Thus, when the pixel PXij displays the black image, a current (that is, a light emitting current led) reduced by a current amount of the bypass current Ibp escaping through the seventh transistor T7 from the driving current Id is provided, and thus the black image may be surely expressed. Thus, the pixel PXij may implement an accurate black grayscale image using the seventh transistor T7, and as a result, a contrast ratio may be improved.

Next, the $j^{th}$ light emitting control signal EMj supplied from the $j^{th}$ light emitting control line EMLj is changed from the high level to a low level. The fifth and sixth transistors T5 and T6 are turned on by the light emitting control signal EMj having the low level. Then, the driving current Id according to a voltage difference between a voltage of the third electrode of the first transistor T1 and the first driving voltage ELVDD is generated, and the driving current Id is supplied to the light emitting element ED through the sixth transistor T6 so that the current led flows to the light emitting element ED.

Referring back to FIG. 4A, the sensor FXdj is connected to a $d^{th}$ read-out line RLd among the read-out lines RL1 to RLh, the $j^{th}$ writing scan line SWLj, and a reset control line SRL.

The sensor FXdj includes a light receiving element OPD and a sensor driving circuit O_SD. As an example of the present disclosure, the light receiving element OPD may be an organic photodiode including an organic material as a photoelectric conversion layer. FIG. 4A illustrates an example of a structure in which the sensor FXdj includes one light receiving element, but embodiments according to the present disclosure are not limited thereto. For example, the sensor FXdj may include a plurality of light emitting elements OPD connected in parallel to each other.

An anode electrode of the light receiving element OPD may be connected to a first sensing node SN1, and a cathode electrode of the light receiving element OPD may be connected to the second driving voltage line VL2 through which the second driving voltage ELVSS is transmitted. The cathode electrode of the light receiving element OPD may be electrically connected to the cathode electrode of the light emitting element ED. As an example of the present disclosure, the cathode electrode of the light receiving element OPD and the cathode electrode of the light emitting element ED may be integrally formed to form a common cathode electrode C_CE (see FIG. 6).

The sensor driving circuit O_SD includes three transistors ST1 to ST3. The three transistors ST1 to ST3 may include the reset transistor ST1, the amplification transistor ST2, and the output transistor ST3. At least one of the reset transistor ST1, the amplification transistor ST2, or the output transistor ST3 may be an oxide semiconductor transistor. As an example of the present disclosure, the reset transistor ST1 may be an oxide semiconductor transistor, and the amplification transistor ST2 and the output transistor ST3 may be LTPS transistors. However, embodiments according to the present disclosure are not particularly limited thereto, and at least the reset transistor ST1 and the output transistor ST3 may be oxide semiconductor transistors, and the amplification transistor ST2 may be an LTPS transistor.

Further, some of the reset transistor ST1, the amplification transistor ST2, and the output transistor ST3 may be P-type transistors, and the other thereof may be N-type transistors. As an example of the present disclosure, the amplification transistor ST2 and the output transistor ST3 may be p-channel metal oxide semiconductor (PMOS) transistors, and the reset transistor ST1 may be an NMOS transistor. However, embodiments according to the present disclosure are not particularly limited thereto, and the reset transistor ST1, the amplification transistor ST2, and the output transistor ST3 may all be N-type transistors or may all be P-type transistors.

Some (e.g., the reset transistor ST1) of the reset transistor ST1, the amplification transistor ST2, and the output transistor ST3 may be the same transistor as the third and fourth transistors T3 and T4 of the pixel PXij. The amplification transistor ST2 and the output transistor ST3 may be the same transistors as the first, second, fifth to eighth transistors T1, T2, and T5 to T8 of the pixel PXij.

A circuit configuration of the sensor driving circuit O_SD according to the present disclosure is not limited to FIG. 4A. The sensor driving circuit O_SD illustrated in FIG. 4A is merely an example, and a configuration of the sensor driving circuit O_SD may be modified and implemented.

The reset transistor ST1 includes a first electrode that receives the reset voltage Vrst, a second electrode connected to the first sensing node SN1, and a third electrode that receives a reset control signal SR. The reset transistor ST1 may reset a potential of the first sensing node SN1 to the reset voltage Vrst in response to the reset control signal SR. The reset control signal SR may be a signal provided through the reset control line SRL. However, embodiments according to the present disclosure are not particularly limited thereto. Alternatively, the reset control signal SR may be the $j^{th}$ compensation scan signal SCj supplied through the $j^{th}$ compensation scan line SCLj. That is, the reset transistor ST1 may receive the $j^{th}$ compensation scan signal SCj supplied from the $j^{th}$ compensation scan line SCLj as the reset control signal SR. As an example of the present disclosure, the reset voltage Vrst may have a voltage level lower than the second driving voltage ELVSS at least during the activation period of the reset control signal SR. The reset voltage Vrst may be transmitted to the sensor FXdj through a reset voltage line VRL. The reset voltage Vrst may be a direct current (DC) voltage maintained at a voltage level lower than the second driving voltage ELVSS.

The reset transistor ST1 may include a plurality of sub-reset transistors connected in series to each other. For example, the reset transistor ST1 may include two sub-reset transistors (hereinafter, referred to as first and second sub-reset transistors). In this case, a third electrode of the first sub-reset transistor and a third electrode of the second sub-reset transistor are connected to the reset control line SRL. Further, a second electrode of the first sub-reset transistor and a first electrode of the second sub-reset transistor may be electrically connected to each other. Further, the reset voltage Vrst may be applied to a first electrode of the first sub-reset transistor, and a second electrode of the second sub-reset transistor may be electrically connected to the first sensing node SN1. However, the number of sub-reset transistors is not limited thereto and may be variously modified.

The amplification transistor ST2 includes a first electrode that receives a sensing driving voltage SLVD, a second electrode connected to a second sensing node SN2, and a third electrode connected to the first sensing node SN1. The amplification transistor ST2 may be turned on according to the potential of the first sensing node SN1 to apply the sensing driving voltage SLVD to the second sensing node SN2. As an example of the present disclosure, the sensing driving voltage SLVD may be one of the first driving voltage ELVDD and the first and second initialization voltages Vint and Vaint. When the sensing driving voltage SLVD is the first driving voltage ELVDD, the first electrode of the amplification transistor ST2 may be electrically connected to the first driving voltage line VL1. When the sensing driving voltage SLVD is the first initialization voltage Vint, the first electrode of the amplification transistor ST2 may be electrically connected to the first initialization voltage line VIL, and when the sensing driving voltage SLVD is the second initialization voltage Vaint, the first electrode of the amplification transistor ST2 may be electrically connected to the second initialization voltage line VAIL.

The output transistor ST3 includes a first electrode connected to the second sensing node SN2, a second electrode connected to the $d^{th}$ read-out line RLd, and a third electrode that receives an output control signal. The output transistor ST3 may transmit a detection signal FSd to the $d^{th}$ read-out line RLd in response to the output control signal. The output control signal may be the $j^{th}$ writing scan signal SWj supplied through the $j^{th}$ writing scan line SWLj. That is, the output transistor ST3 may receive the $j^{th}$ writing scan signal SWj supplied from the $j^{th}$ writing scan line SWLj as the output control signal.

The light receiving element OPD of the sensor FXdj may be exposed to a light beam during a light emitting period of the light emitting element ED. The light beam may be a light beam output from the light emitting element ED.

When the hand US_F (see FIG. 1) of a user touches the display surface IS (see FIG. 1), the light receiving element OPD generates photocharges corresponding to light beams reflected by ridges or valleys between the ridges of the fingerprint. The amount of current flowing through the light receiving element OPD varies according to the generated photocharges. When the light receiving element OPD receives the light beams reflected by the ridges of the fingerprint, a current flowing through the light receiving element OPD may be referred to as a first current, and when the light receiving element OPD receives the light beams reflected by the valleys of the fingerprint, a current flowing through the light receiving element OPD may be referred to as a second current. Since the amount of the light beams reflected by the ridges of the fingerprint and the amount of the light beams reflected by the valleys of the fingerprint are different, a difference between the amounts of the light beams corresponds to a difference between the first and second currents. When the first current flows through the light receiving element OPD, the potential of the first sensing node SN1 may be referred to as a first potential, and when the second current flows through the light receiving element OPD, the potential of the first sensing node SN1 may be referred to as a second potential. As an example of the present disclosure, the first current may be greater than the second current, and in this case, the first potential may be lower than the second potential.

The amplification transistor ST2 may be a source follower amplifier that generates a source-drain current in proportion to the potential of the first sensing node SN1 input to the third electrode.

During the fourth activation period AP4, the $j^{th}$ writing scan signal SWj having the low level is supplied to the output transistor ST3 through the $j^{th}$ writing scan line SWLj. When the output transistor ST3 is turned on in response to the $j^{th}$ writing scan signal SWj having the low level, the detection signal FSd corresponding to the current flowing through the amplification transistor ST2 may be output to the $d^{th}$ read-out line RLd.

Next, when the reset control signal SR having the high level is supplied through the reset control line SRL during a reset period, the reset transistor ST1 is turned on. The reset period may be defined as an activation period (that is, a high level period) of the reset control line SRL. Alternatively, when the reset transistor ST1 is a P-type transistor, the reset control signal SR having the low level may be supplied to the reset control line SRL during the reset period. During the reset period, the first sensing node SN1 may be reset to a potential corresponding to the reset voltage Vrst. As an example of the present disclosure, the reset voltage Vrst may have a voltage level lower than that of the second driving voltage ELVSS.

Next, when the reset period terminates, the light receiving element OPD may generate photocharges corresponding to the received light beam, and the generated photocharges may be accumulated in the first sensing node SN1.

Figure 5:
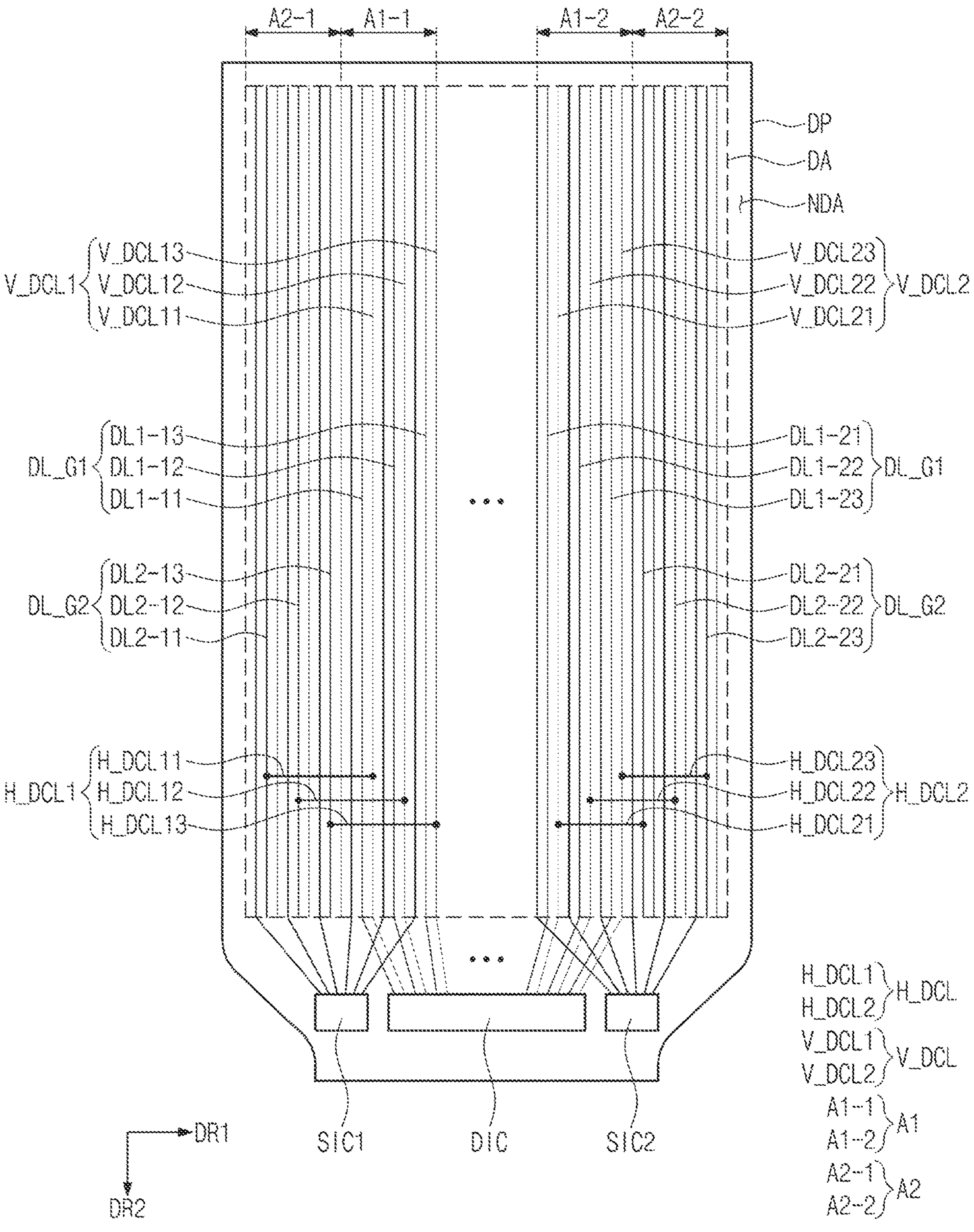
FIG. 5 is a plan view of a display panel according to some embodiments of the present disclosure.

FIG. 5 is a plan view of a display panel according to some embodiments of the present disclosure. However, for convenience of description, scan lines and data lines are omitted, and only read-out lines are illustrated in FIG. 5.

Referring to FIG. 5, the display panel DP includes the display area DA and the non-display area NDA. The plurality of pixels PX (see FIG. 3) and the plurality of sensors FX (see FIG. 3) are arranged in the display area DA. The driving chip DIC and the sensor chips SIC1 and SIC2 are mounted on the non-display area NDA.

The data lines DL1 to DLm (see FIG. 3) are connected to the plurality of pixels PX in the display area DA and connected to the driving chip DIC in the non-display area NDA. The read-out lines RL1 to RLh (see FIG. 3) are connected to the plurality of sensors FX in the display area DA and connected to the sensor chips SIC1 and SIC2 in the non-display area NDA.

The data lines DL1 to DLm may be classified into a first group and a second group. The first group includes a plurality of first data lines DL_G1, and the second group includes a plurality of second data lines DL_G2. The plurality of first data lines DL_G1 are arranged in the first direction DR1, and the plurality of second data lines DL_G2 are arranged in the first direction DR1. The plurality of first data lines DL_G1 are spaced apart from the plurality of second data lines DL_G2 in the first direction DR1.

The plurality of first data lines DL_G1 are connected to the pixel driving circuit P_PD of the pixels belonging to the first group among the plurality of pixels PX, and the second data lines DL_G2 are connected to the pixel driving circuit P_PD of the pixels belonging to the second group among the plurality of pixels PX. The pixels belonging to the first group and the first data lines DL_G1 are located in a first area A1, and the pixels belonging to the second group and the second data lines DL_G2 are located in a second area A2. The first area A1 includes a $(1\text{-}1)^{th}$ area A1-1 defined on a first side with respect to a center line of the display panel DP parallel to the second direction DR2 and a $(1\text{-}2)^{th}$ area A1-2 defined on a second side with respect to the center line. The second area A2 includes a $(2\text{-}1)^{th}$ area A2-1 located between the $(1\text{-}1)^{th}$ area A1-1 and the non-display area NDA, and a $(2\text{-}2)^{th}$ area A2-2 located between the $(1\text{-}2)^{th}$ area A1-2 and the non-display area NDA.

The plurality of first data lines DL_G1 include $(1\text{-}1)^{th}$ data lines DL1-11 to DL1-13 arranged in the $(1\text{-}1)^{th}$ area A1-1 and $(1\text{-}2)^{th}$ data lines DL1-21 to DL1-23 arranged in the $(1\text{-}2)^{th}$ area A1-2. The plurality of second data lines DL_G2 include $(2\text{-}1)^{th}$ data lines DL2-11 to DL2-13 arranged in the $(2\text{-}1)^{th}$ area A2-1 and $(2\text{-}2)^{th}$ data lines DL2-21 to DL2-23 arranged in the $(2\text{-}2)^{th}$ area A2-2.

The $(1\text{-}1)^{th}$ data lines DL1-11 to DL1-13 and the $(1\text{-}2)^{th}$ data lines DL1-21 to DL1-23 are connected to the driving chip DIC (or the data driver 200 (see FIG. 3)). FIG. 5 illustrates that the $(1\text{-}1)^{th}$ data lines DL1-11 to DL1-13 and the $(1\text{-}2)^{th}$ data lines DL1-21 to DL1-23 are connected to the same driving chip DIC, but embodiments according to the present disclosure are not limited thereto. For example, the $(1\text{-}1)^{th}$ data lines DL1-11 to DL1-13 and the $(1\text{-}2)^{th}$ data lines DL1-21 to DL1-23 may be connected to different driving chips.

The display panel DP further includes data connection lines connecting the second data lines DL_G2 to the driving chip DIC. The data connection lines include a plurality of vertical data connection lines V_DCL extending along the first data lines DL_G1 and a plurality of horizontal data connection lines H_DCL extending in the first direction DR1.

The plurality of horizontal data connection lines H_DCL include first horizontal data connection lines H_DCL11 to H_DCL13 and second horizontal data connection lines H_DCL21 to H_DCL23. The first horizontal data connection lines H_DCL11 to H_DCL13 are connected to the $(2\text{-}1)^{th}$ data lines DL2-11 to DL2-13, and the second horizontal data connection lines H_DCL21 to H_DCL23 are connected to the $(2\text{-}2)^{th}$ data lines DL2-21 to DL2-23. The plurality of vertical data connection lines V_DCL includes first vertical data connection lines V_DCL11 to V_DCL13 and second vertical data connection lines V_DCL21 to V_DCL23. The first vertical data connection lines V_DCL11 to V_DCL13 are connected to the first horizontal data connection lines H_DCL11 to H_DCL13, and the second vertical data connection lines V_DCL21 to V_DCL23 are connected to the second horizontal data connection lines H_DCL21 to H_DCL23.

Thus, the first vertical data connection lines V_DCL11 to V_DCL13 are electrically connected to the $(2\text{-}1)^{th}$ data lines DL2-11 to DL2-13 by the first horizontal data connection lines H_DCL11 to H_DCL13. The second vertical data connection lines V_DCL21 to V_DCL23 are electrically connected to the $(2\text{-}2)^{th}$ data lines DL2-21 to DL2-23 by the second horizontal data connection lines H_DCL21 to H_DCL23.

The first vertical data connection lines V_DCL11 to V_DCL13 and the $(1\text{-}1)^{th}$ data lines DL1-11 to DL1-13 are alternately and repeatedly arranged in the $(1\text{-}1)^{th}$ area A1-1. The second vertical data connection lines V_DCL21 to V_DCL23 and the $(1\text{-}2)^{th}$ data lines DL1-21 to DL1-23 are alternately and repeatedly arranged in the $(1\text{-}2)^{th}$ area A1-2.

Some of the vertical data connection lines V_DCL and the plurality of horizontal data connection lines H_DCL may be arranged in the display area DA. That is, some of the data connection lines for connecting the second data lines DL_G2 and the driving chip DIC are arranged inside the display area DA. Thus, an area of a region occupied by the data connection lines inside the non-display area NDA may be reduced, and as a result, an area of a dead space of the display panel DP may be reduced.

Figure 6:
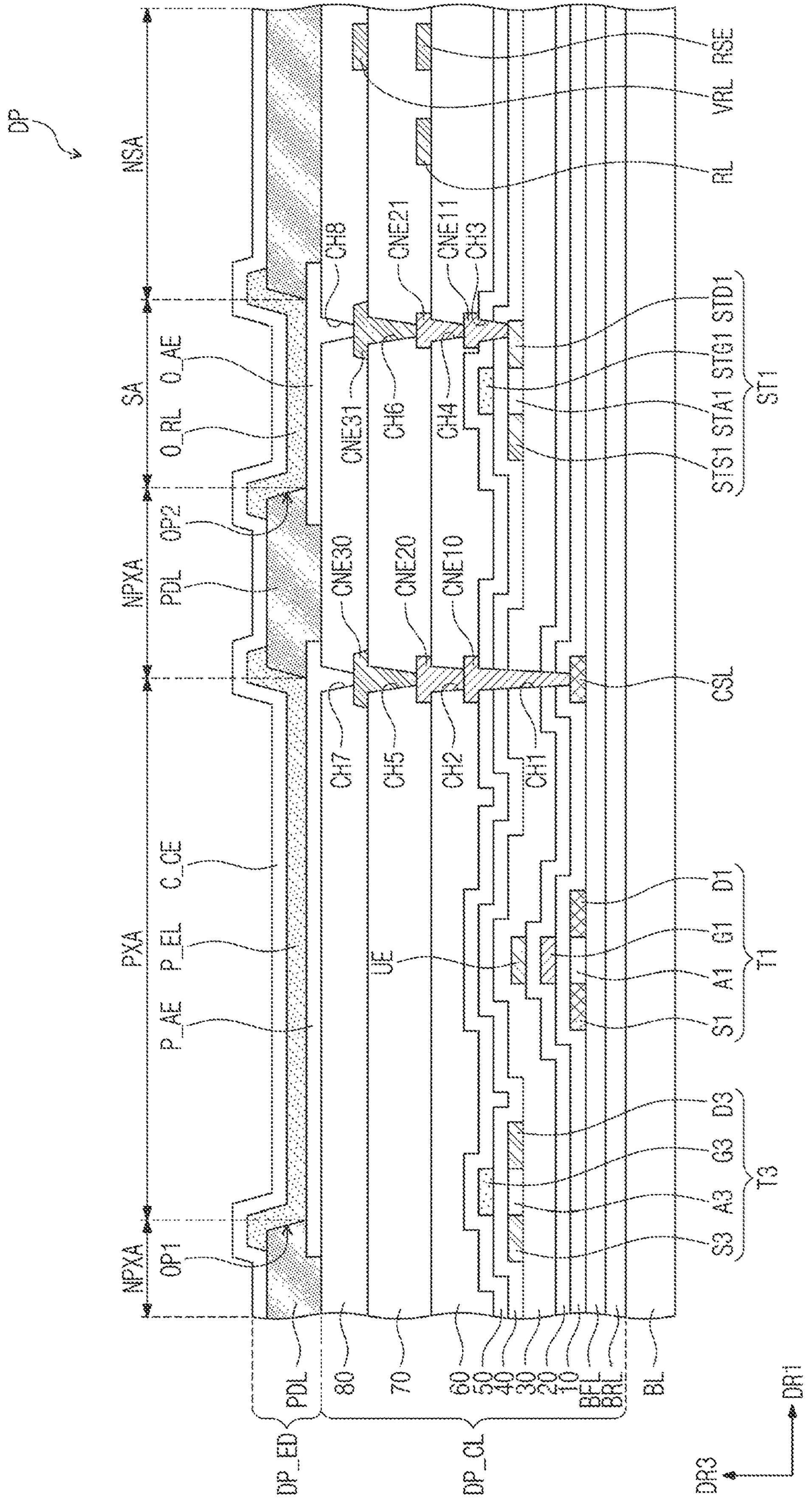
FIG. 6 is a cross-sectional view of the display panel according to some embodiments of the present disclosure.

FIG. 6 is a cross-sectional view of the display panel according to some embodiments of the present disclosure.

Referring to FIG. 6, the display panel DP may include the base layer BL, the circuit layer DP_CL, and the element layer DP_ED.

The base layer BL may include a synthetic resin layer. The synthetic resin layer may include a thermosetting resin. In particular, the synthetic resin layer may be a polyimide resin layer, and the material thereof is not particularly limited. The synthetic resin layer may include at least one of an acrylic resin, a methacrylic resin, a polyisoprene, a vinyl resin, an epoxy resin, an urethane-based resin, a cellulosic resin, a siloxane-based resin, a polyamide resin, or a perylene-based resin. In addition, the base layer BL may include a glass substrate, a metal substrate, an organic/inorganic composite material substrate, or the like.

At least one inorganic layer is formed on an upper surface of the base layer BL. The inorganic layer may include at least one of an aluminum oxide, a titanium oxide, a silicon oxide, a silicon oxy nitride, a zirconium oxide, or a hafnium oxide. The multi-layered inorganic layers may constitute a barrier layer BRL and/or a buffer layer BFL, which will be described below. The barrier layer BRL and the buffer layer BFL may be selectively arranged.

The circuit layer DP_CL may include the barrier layer BRL and/or the buffer layer BFL. The barrier layer BRL prevents or reduces inflow of foreign substances or contaminants from the outside. The barrier layer BRL may include a silicon oxide layer and a silicon nitride layer. Each of the silicon oxide layer and the silicon nitride layer may be provided in plurality and the silicon oxide layers and the silicon nitride layers may be alternately laminated.

The buffer layer BFL may be located on the barrier layer BRL. The buffer layer BFL improves a coupling force between the base layer BL and a semiconductor pattern and/or a conductive pattern. The buffer layer BFL may include a silicon oxide layer and a silicon nitride layer. The silicon oxide layer and the silicon nitride layer may be alternately laminated.

The semiconductor pattern is located on the buffer layer BFL. Hereinafter, the semiconductor pattern directly located on the buffer layer BFL is defined as a first semiconductor pattern. The first semiconductor pattern may include a silicone semiconductor. The first semiconductor pattern may include polysilicon. However, embodiments according to the present disclosure are not particularly limited thereto, and the first semiconductor pattern may include amorphous silicon.

FIG. 6 merely illustrates a portion of the first semiconductor pattern, and the first semiconductor pattern may be further located in another area of the pixel PXij (see FIG. 4A). The first semiconductor pattern has different electrical properties depending on whether the first semiconductor pattern is doped. The first semiconductor pattern may include a doped area and a non-doped area. The doped area may be doped with an N-type dopant or P-type dopant. A P-type transistor includes a doped area doped with the P-type dopant, and an N-type transistor includes a doped area doped with the N-type dopant.

The doped area has conductivity higher than that of the non-doped area and substantially serves as an electrode or a signal line. The non-doped area substantially corresponds to an active area (or a channel) of the transistor. In other words, a portion of the first semiconductor pattern may be an active area of the transistor, another portion of the first semiconductor pattern may be a source area or a drain area of the transistor, and still another portion of the first semiconductor pattern may be a connection signal line (or a connection electrode).

As illustrated in FIG. 6, a first electrode S1, a channel part A1, and a second electrode D1 of the first transistor T1 are formed from the first semiconductor pattern. The first electrode S1 and the second electrode D1 of the first transistor T1 extend from the channel part A1 in opposite directions.

FIG. 6 illustrates a portion of a connection signal line CSL formed from the semiconductor pattern. Although not separately illustrated, the connection signal line CSL may be connected to a second electrode of the sixth transistor T6 (see FIG. 4A) in a plan view.

A first insulating layer 10 is located on the buffer layer BFL. The first insulating layer 10 commonly overlaps the plurality of pixels PX (see FIG. 3) and covers the first semiconductor pattern. The first insulating layer 10 may be an inorganic layer and/or an organic layer and may have a single-layer structure or a multi-layer structure. The first insulating layer 10 may include at least one of an aluminum oxide, a titanium oxide, a silicon oxide, a silicon oxy nitride, a zirconium oxide, or a hafnium oxide. According to some embodiments, the first insulating layer 10 may be a single-layered silicon oxide layer. An insulating layer of the circuit layer DP_CL, which will be described below, as well as first insulating layer 10 and may be an inorganic layer and/or an organic layer, and may have a single-layer structure or a multi-layer structure. The inorganic layer may include at least one of the above-described materials.

A third electrode G1 of the first transistor T1 is located on the first insulating layer 10. The third electrode G1 of the first transistor T1 overlaps the channel part A1 of the first transistor T1. In a process of doping the first semiconductor pattern, the third electrode G1 of the first transistor T1 may serve as a mask.

A second insulating layer 20 that covers the third electrode G1 is located on the first insulating layer 10. The second insulating layer 20 commonly overlaps the plurality of pixels PX. The second insulating layer 20 may be an inorganic layer and/or an organic layer and may have a single-layer structure or a multi-layer structure. According to some embodiments, the second insulating layer 20 may be a single-layered silicon oxide layer.

An upper electrode UE may be located on the second insulating layer 20. The upper electrode UE may overlap the third electrode G1. A portion of the third electrode G1 and the upper electrode UE overlapping the portion of the third electrode G1 may define the capacitor Cst (see FIG. 4A). According to some embodiments of the present disclosure, the upper electrode UE may be omitted.

According to some embodiments of the present disclosure, the second insulating layer 20 may be replaced with an insulating pattern. The upper electrode UE is located on the insulating pattern. The upper electrode UE may serve as a mask that forms the insulating pattern from the second insulating layer 20.

A third insulating layer 30 that covers the upper electrode UE is located on the second insulating layer 20. According to some embodiments, the third insulating layer 30 may be a single-layered silicon oxide layer. A semiconductor pattern is located on the third insulating layer 30. Hereinafter, the semiconductor pattern directly located on the third insulating layer 30 is defined as a second semiconductor pattern. The second semiconductor pattern may include a metal oxide. An oxide semiconductor may include a crystalline or amorphous oxide semiconductor. For example, the oxide semiconductor may include a metal oxide of zinc (Zn), indium (In), gallium (Ga), tin (Sn), and titanium (Ti), a metal such as zinc (Zn), indium (In), gallium (Ga), tin (Sn), and titanium (Ti), or a mixture of oxides thereof. The oxide semiconductor may include an indium-tin oxide (ITO), an indium-gallium-zinc oxide (IGZO), a zinc oxide (ZnO), an indium-zinc oxide (IZO), a zinc-indium oxide (ZIO), an indium oxide (InO), a titanium oxide (TiO), an indium-zinc-tin oxide (IZTO), a zinc-tin oxide (ZTO), and the like.

FIG. 6 merely illustrates a portion of the second semiconductor pattern, and the second semiconductor pattern may be further located in another area of the pixel PXij. The second semiconductor pattern may include a plurality of areas that are classified according to whether the metal oxide is reduced. An area (hereinafter, referred to as a reduced area) in which the metal oxide is reduced has conductivity higher than that of an area (hereinafter, a non-reduced area) in which the metal oxide is not reduced. The reduced area substantially serves as an electrode or a signal line. The non-reduced area substantially corresponds to a channel part A3 of the third transistor T3. In other words, a portion of the second semiconductor pattern may be the channel part A3 of the third transistor T3, and another portion thereof may be a first electrode S3 or a second electrode D3 of the third transistor T.

The circuit layer DP_CL may further include a portion of a semiconductor pattern of the sensor driving circuit O_SD (see FIG. 4A). For convenience of description, the reset transistor ST1 among the semiconductor pattern of the sensor driving circuit O_SD is illustrated. A first electrode STS1, a channel part STA1, and a second electrode STD1 of the reset transistor ST1 are formed from the second semiconductor pattern. As an example of the present disclosure, the second semiconductor pattern may include a metal oxide. The first electrode STS1 and the second electrode STD1 include a metal reduced from a metal oxide semiconductor. The first electrode STS1 and the second electrode STD1 may include a metal layer having a thickness (e.g., a set or predetermined thickness) from an upper surface of the second semiconductor pattern and including the reduced metal.

A fourth insulating layer 40 is arranged to cover the first electrode S3, the channel part A3 and the second electrode D3 of the third transistor T3, and the first electrode STS1, the channel part STA1, and the second electrode STD1 of the reset transistor ST1. A third electrode G3 of the third transistor T3 and a third electrode STG1 of the reset transistor ST1 are located on the fourth insulating layer 40. The third electrode G3 of the third transistor T3 overlaps the channel part A3 of the third transistor T3, and the third electrode STG1 of the reset transistor ST1 overlaps the channel part STA1 of the reset transistor ST1. According to some embodiments, for convenience of description, one third electrode STG1 is illustrated, but the first reset transistor ST1 may also include two third electrodes.

A fifth insulating layer 50 that covers the third electrode G3 of the third transistor T3 and the third electrode STG1 of the reset transistor ST1 is located on the fourth insulating layer 40. According to some embodiments, the fifth insulating layer 50 may include a silicon oxide layer and a silicon nitride layer. The fifth insulating layer 50 may include a plurality of silicon oxide layers and a plurality of silicon nitride layers that are alternately laminated.

At least one insulating layer is further located on the fifth insulating layer 50. According to some embodiments, a sixth insulating layer 60 and a seventh insulating layer 70 may be arranged on the fifth insulating layer 50. The sixth insulating layer 60 and the seventh insulating layer 70 may be organic layers and may have a single-layer or multi-layer structure. The sixth insulating layer 60 and the seventh insulating layer 70 may be single-layer polyimide resin layers. Embodiments according to the present disclosure are not particularly limited thereto, and the sixth insulating layer 60 and the seventh insulating layer 70 may include at least one of an acrylic resin, a methacrylic resin, a polyisoprene, a vinyl resin, an epoxy resin, an urethane-based resin, a cellulosic resin, a siloxane-based resin, a polyamide resin, or a perylene-based resin.

A first connection electrode CNE10 may be located on the fifth insulating layer 50. The first connection electrode CNE10 is connected to the connection signal line CSL through a first contact hole CH1 passing through the first to fifth insulating layers 10 to 50. A second connection electrode CNE20 may be connected to the first connection electrode CNE10 through a second contact hole CH2 passing through the sixth insulating layer 60. According to some embodiments of the present disclosure, at least one of the fifth insulating layer 50 to the seventh insulating layer 70 may be omitted, and one of the first and second connection electrodes CNE10 and CNE20 may also be omitted.

A third connection electrode CNE11 may be further located on the fifth insulating layer 50. The third connection electrode CNE11 is connected to the second electrode STD1 of the reset transistor ST1 through a third contact hole CH3 passing through the fourth and fifth insulating layers 40 and 50. A fourth connection electrode CNE21 may be connected to the third connection electrode CNE11 through a fourth contact hole CH4 passing through the sixth insulating layer 60.

Figure 9:
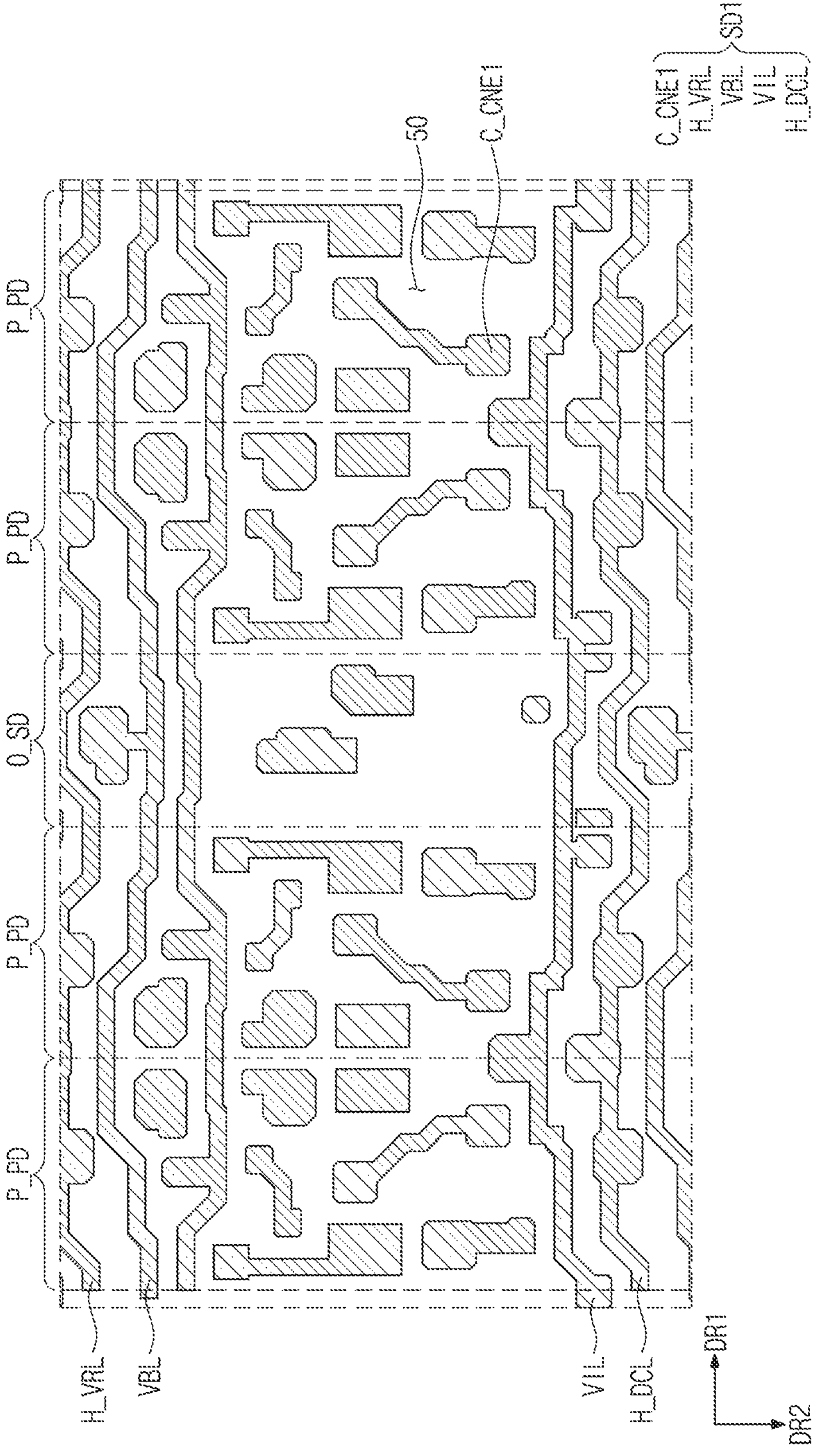
FIG. 9 is a plan view illustrating a first data pattern layer illustrated in FIG. 8.
Figure 10A:
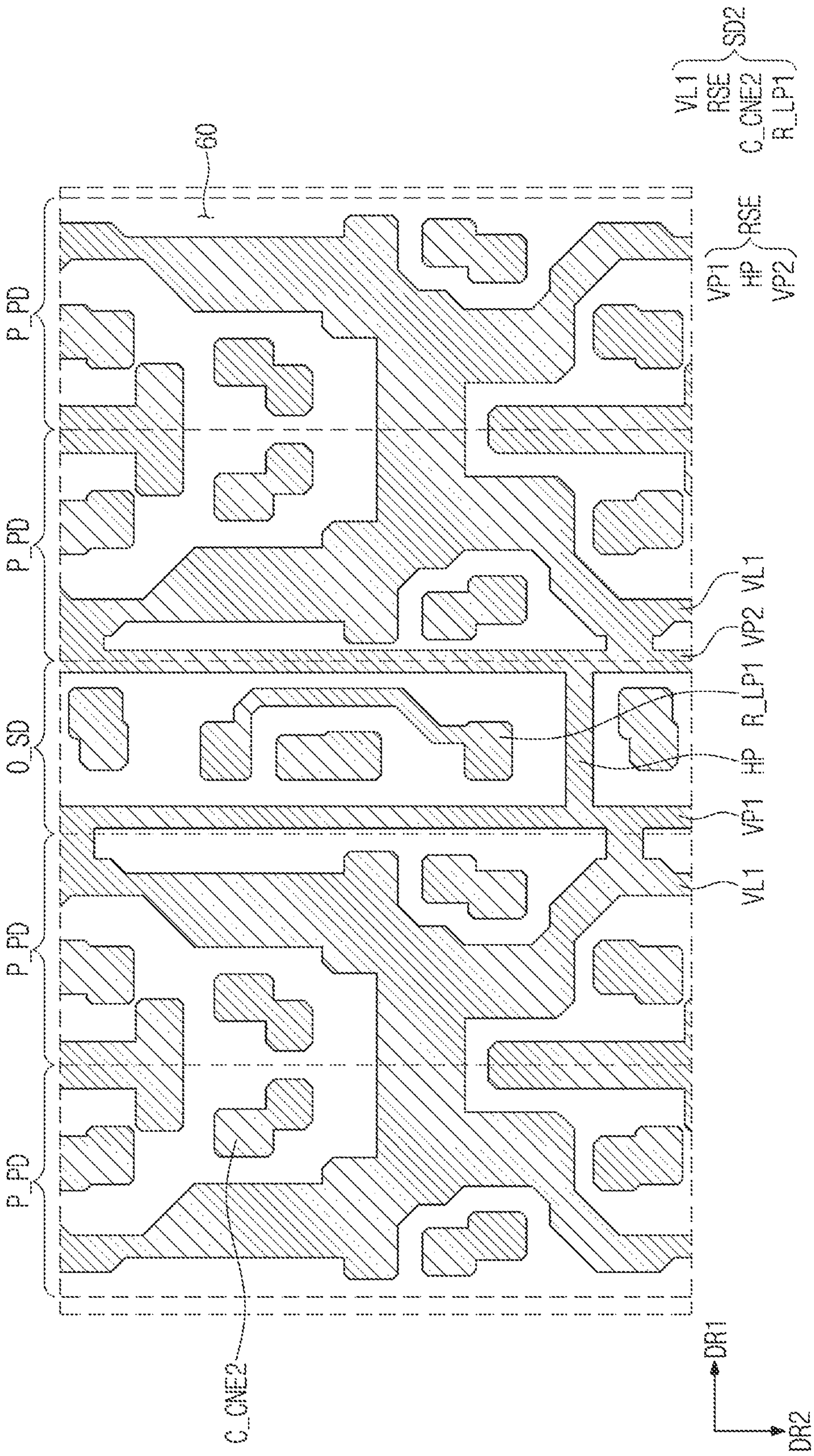
FIG. 10A is a plan view illustrating a second data pattern layer illustrated in FIG. 8.

The first and third connection electrodes CNE10 and CNE11 may be portions of a first data pattern layer SD1 (see FIG. 9), and the second and fourth connection electrodes CNE20 and CNE21 may be portions of a second data pattern layer SD2 (see FIG. 10A).

The horizontal data connection lines H_DCL (see FIG. 5) may be arranged on the same layer as that of the first and third connection electrodes CNE10 and CNE11 (that is, on the fifth insulating layer 50). However, embodiments according to the present disclosure are not particularly limited thereto. The horizontal data connection lines H_DCL may be arranged on the same layer as that of the first electrode G1 of the first transistor T1 (that is, on the first insulating layer 10).

The read-out wiring RL may be located on the same layer as that of the second and fourth connection electrodes CNE20 and CNE21 (that is, on the sixth insulating layer 60). The read-out wiring RL may be one of the read-out lines RL1 to RLh illustrated in FIG. 3. The second and fourth connection electrodes CNE20 and CNE21 and the read-out wiring RL are covered by the seventh insulating layer 70.

A shielding electrode wiring RSE may be located on the sixth insulating layer 60, and the reset voltage line VRL may be located on the seventh insulating layer 70. The shielding electrode wiring RSE may overlap the reset voltage line VRL in a plan view.

A fifth connection electrode CNE30 and a sixth connection electrode CNE31 may be further arranged on the seventh insulating layer 70. The fifth connection electrode CNE30 may be connected to the second connection electrode CNE20 through a fifth contact hole CH5 passing through the seventh insulating layer 70. The sixth connection electrode CNE31 may be connected to the fourth connection electrode CNE21 through a sixth contact hole CH6 passing through the seventh insulating layer 70. A data wiring DL (see FIG. 11) and the vertical data connection lines V_DCL (see FIG. 11) may be further arranged on the seventh insulating layer 70. The reset voltage line VRL, the data wiring DL, the vertical data connection lines V_DCL, the fifth connection electrode CNE30, and the sixth connection electrode CNE31 are covered by an eighth insulating layer 80.

The element layer DP_ED is located on the circuit layer DP_CL. The element layer DP_ED may include an anode electrode P_AE of the light emitting element ED (see FIG. 4A) and an anode electrode O_AE of the light receiving element OPD (see FIG. 4A). As illustrated in FIG. 6, the anode electrode P_AE of the light emitting element ED may be connected to the fifth connection electrode CNE30 through a seventh contact hole CH7 passing through the eighth insulating layer 80. The anode electrode O_AE of the light receiving element OPD may be connected to the sixth connection electrode CNE31 through an eighth contact hole CH8 passing through the eighth insulating layer 80.

FIG. 6 illustrates a structure in which the circuit layer DP_CL includes the fifth connection electrode CNE30 and the sixth connection electrode CNE31, but embodiments according to the present disclosure are not particularly limited thereto. Alternatively, the fifth connection electrode CNE30 and the sixth connection electrode CNE31 may be omitted from the circuit layer DP_CL. In this case, the anode electrode P_AE may be directly connected to the second connection electrode CNE20, and the anode electrode O_AE may be directly connected to the fourth connection electrode CNE21.

The element layer DP_ED further includes a pixel definition film PDL located on the circuit layer DP_CL. The pixel definition film PDL may include a light emitting opening OP1 defined to correspond to the light emitting element ED and a light receiving opening OP2 defined to correspond to the light receiving element OPD. The light emitting opening OP1 exposes at least a portion of the anode electrode P_AE of the light emitting element ED. The light emitting opening OP1 of the pixel definition film PDL may define a light emitting area PXA. For example, the plurality of pixels PX (see FIG. 3) may be arranged in a regular rule on a plane of the display panel DP (see FIG. 3). An area in which the plurality of pixels PX are arranged may be defined as a pixel area, and one pixel area may include the light emitting area PXA and a non-light emitting area NPXA adjacent to the light emitting area PXA. The non-light emitting area NPXA may surround the light emitting area PXA.

The light receiving opening OP2 exposes the anode electrode O_AE of the light receiving element OPD. The light receiving opening OP2 of the pixel definition film PDL may define a light receiving area SA. For example, the plurality of sensors FX (refer to FIG. 3) may be arranged in a regular rule on the plane of the display panel DP. An area in which the plurality of sensors FX are arranged may be defined as a sensing area, and one sensing area may include the light receiving area SA and a non-light receiving area NSA adjacent to the light receiving area SA. The non-light receiving area NSA may surround the light receiving area SA.

A light emitting layer P_EL is arranged to correspond to the light emitting opening OP1 defined in the pixel definition film PDL, and a photoelectric conversion layer O_RL is provided to correspond to the light receiving opening OP2 defined in the pixel definition film PDL. According to some embodiments, the patterned light emitting layer P_EL is illustrated as an example, but embodiments according to the present disclosure are not limited thereto. A common light emitting layer may be commonly arranged in the plurality of pixels PX. In this case, the common light emitting layer may generate a white light beam or a blue light beam. The common cathode electrode C_CE is commonly connected to the light emitting element ED and the light receiving element OPD. The common cathode electrode C_CE may face the anode electrode O_AE and the anode electrode P_AE. The common cathode electrode C_CE is located on the light emitting layer P_EL and the photoelectric conversion layer O_RL. The common cathode electrode C_CE is commonly arranged in the plurality of pixels PX and the plurality of sensors FX.

Figure 7:
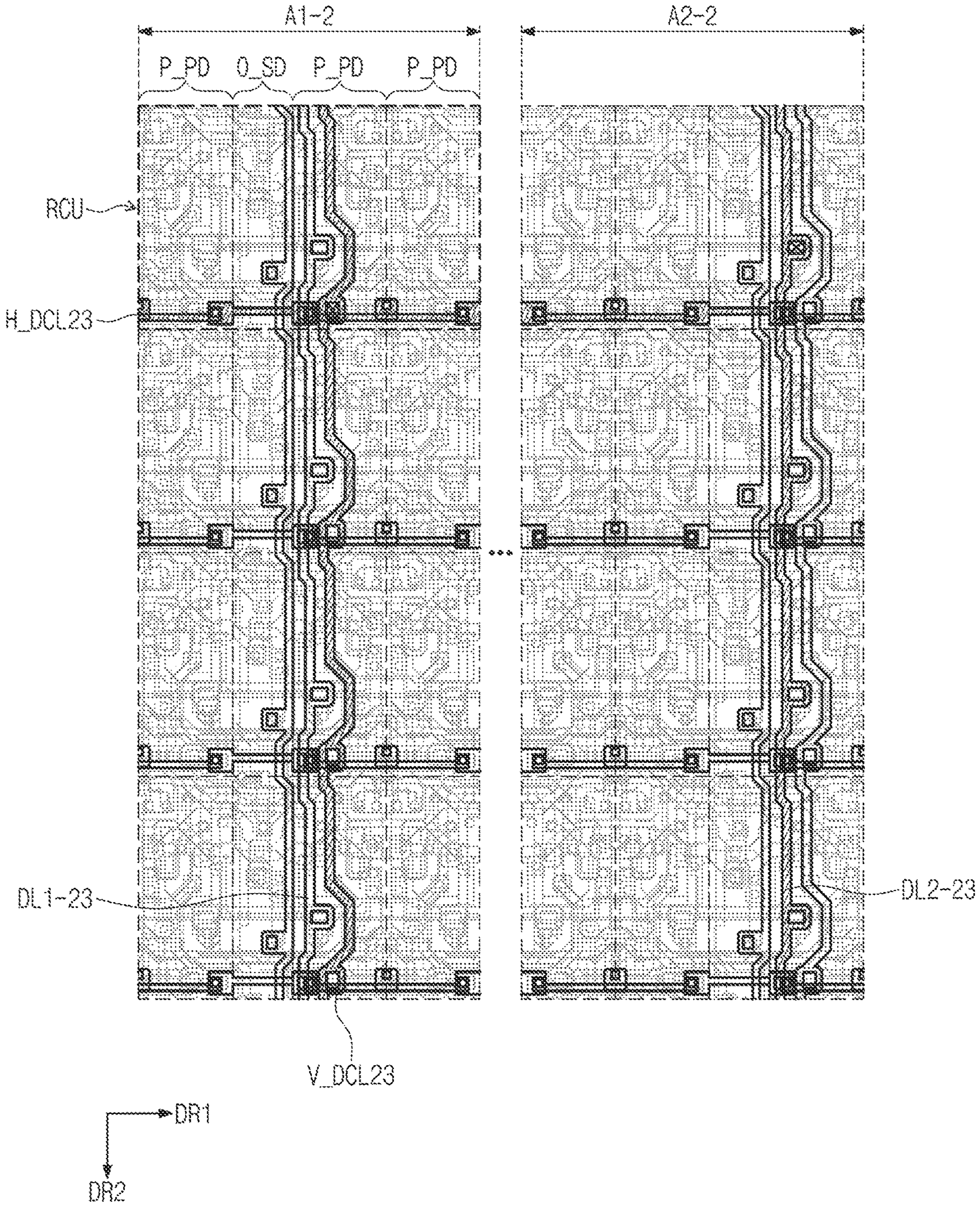
FIG. 7 is an enlarged plan view illustrating a portion of the display panel according to some embodiments of the present disclosure.

FIG. 7 is an enlarged plan view illustrating a portion of the display panel according to some embodiments of the present disclosure. Conductive patterns and the semiconductor patterns of the display panel may be repeatedly arranged in a rule (e.g., a set or predetermined rule) in a plan view. FIG. 7 illustrates some of the pixel driving circuits P_PD and some of the sensor driving circuits O_SD.

The circuit layer DP_CL includes a plurality of reference circuit parts RCU, and each reference circuit part RCU includes at least one sensor driving circuit O_SD and at least one pixel driving circuit P_PD. FIG. 7 illustrates a structure in which one sensor driving circuit O_SD and three pixel driving circuits P_PD are included in one reference circuit part RCU. However, the number of sensor driving circuits O_SD included in each reference circuit part RCU and the number of pixel driving circuits P_PD included in each reference circuit part RCU are not particularly limited.

Referring to FIGS. 5 to 7, the display area DA of the display panel DP may be divided into the first area A1 in which the first data lines DL_G1 are arranged and the second area A2 in which the second data lines DL_G2 are arranged. The first area A1 is an area in which the vertical data connection lines V_DCL1 and V_DCL2 connected to the second data lines DL_G2 are arranged together with the first data lines DL_G1.

FIG. 7 illustrates some of the (1-2)$^{th}$ data lines DL1-21 to DL1-23, some of the (2-2)$^{th}$ data lines DL2-21 to DL2-23, some of the second vertical data connection lines V_DCL2, and some of the second horizontal connection lines H_DCL2. However, the (1-1)$^{th}$ data lines DL1-11 to DL1-13, the (2-1)$^{th}$ data lines DL2-11 to DL2-13, the first vertical data connection lines V_DCL1, and the first horizontal connection lines H_DCL1 also have similar structures, and thus duplicated descriptions thereof will be omitted.

The data line DL2-23 among the (2-2)$^{th}$ data lines DL2-21 to DL2-23 may be connected to the corresponding (2-3)$^{th}$ horizontal data connection line H_DCL23 among the second horizontal data connection lines H_DCL21 to H_DCL23 in the (2-2)$^{th}$ area A2-2. The (2-3)$^{th}$ horizontal data connection line H_DCL23 may be connected to the corresponding (2-3)$^{th}$ vertical data connection line V_DCL23 among the second vertical data connection lines V_DCL2 in the (1-2)$^{th}$ area A1-2.

The second horizontal data connection lines H_DCL21 to H_DCL23 are arranged on a different layer from that of the (2-2)$^{th}$ data lines DL2-21 to DL2-23 and are arranged on a different layer from that of the second vertical data connection lines V_DCL2. The (2-2)$^{th}$ data lines DL2-21 to DL2-23 and the second vertical data connection lines V_DCL2 are arranged on the same layer.

As an example of the present disclosure, the (2-3)$^{th}$ horizontal data connection line H_DCL23 is located on the fifth insulating layer 50, but the (2-3)$^{th}$ vertical data connection line V_DCL23 and the (2-2)$^{th}$ data lines DL2-21 to DL2-23 are arranged on the seventh insulating layer 70.

The (2-3)$^{th}$ horizontal data connection line H_DCL23 may be electrically connected to the (2-3)$^{th}$ vertical data connection line V_DCL23 through a first data bridge electrode in the (1-2)$^{th}$ area A1-2. The first data bridge electrode may be located on the sixth insulating layer 60. The first data bridge electrode is directly connected to the (2-3)$^{th}$ horizontal data connection line H_DCL23 through a first data bridge contact hole provided in the sixth insulating layer 60. The (2-3)$^{th}$ vertical data connection line V_DCL23 is directly connected to the first data bridge electrode through a second data bridge contact hole provided in the seventh insulating layer 70.

As an example of the present disclosure, the (2-3)$^{th}$ horizontal data connection line H_DCL23 may be electrically connected to a corresponding data line DL2_23 through a second data bridge electrode in the (2-2)$^{th}$ area A2-2. The second data bridge electrode may be located on the sixth insulating layer 60. The second data bridge electrode is directly connected to the (2-3)$^{th}$ horizontal data connection line H_DCL23 through a third data bridge contact hole provided in the sixth insulating layer 60. The data line DL2_23 is directly connected to the second data bridge electrode through a fourth data bridge contact hole provided in the seventh insulating layer 70.

Figure 8:
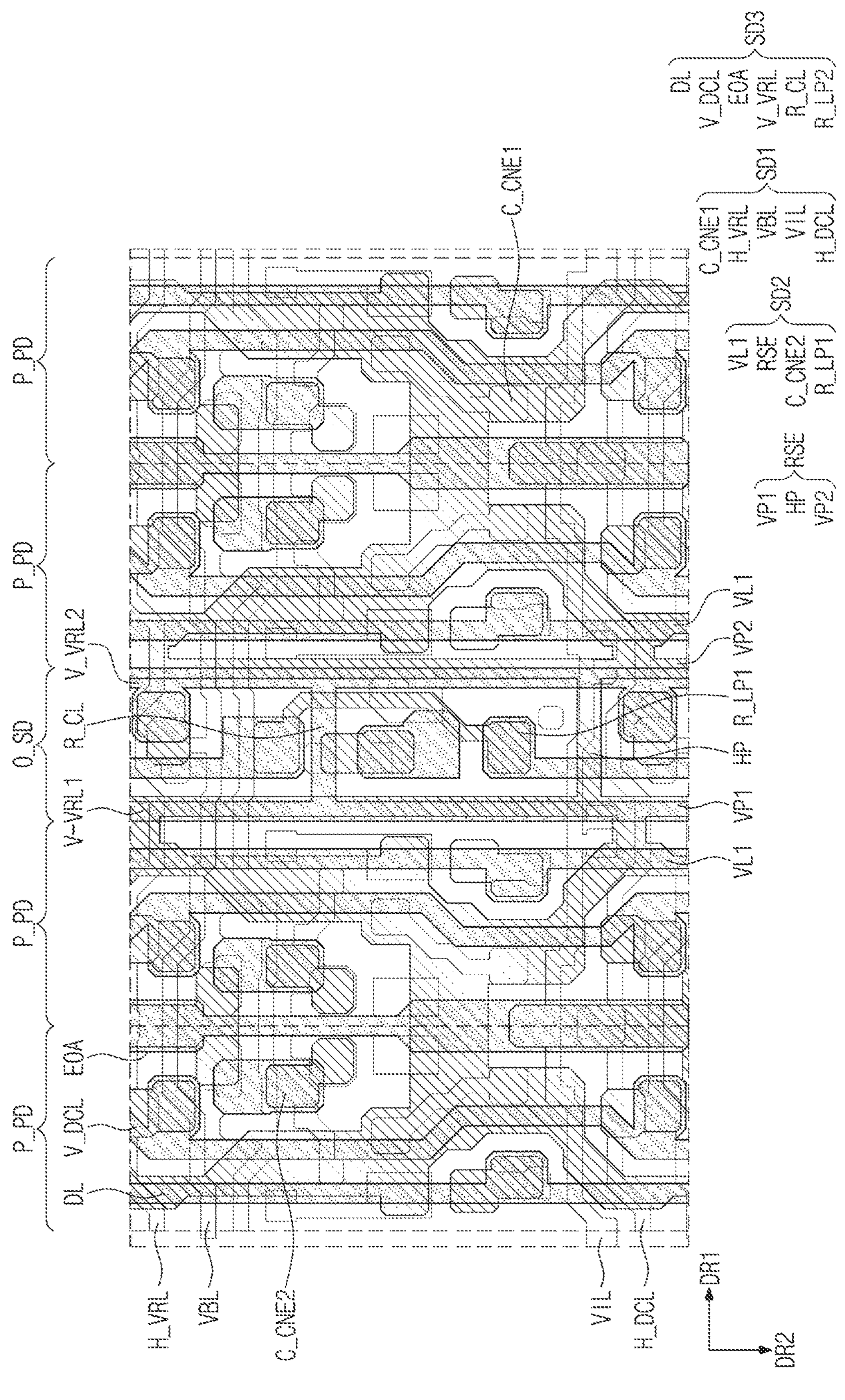
FIG. 8 is an enlarged plan view illustrating a portion of the display panel according to some embodiments of the present disclosure.
Figure 10B:
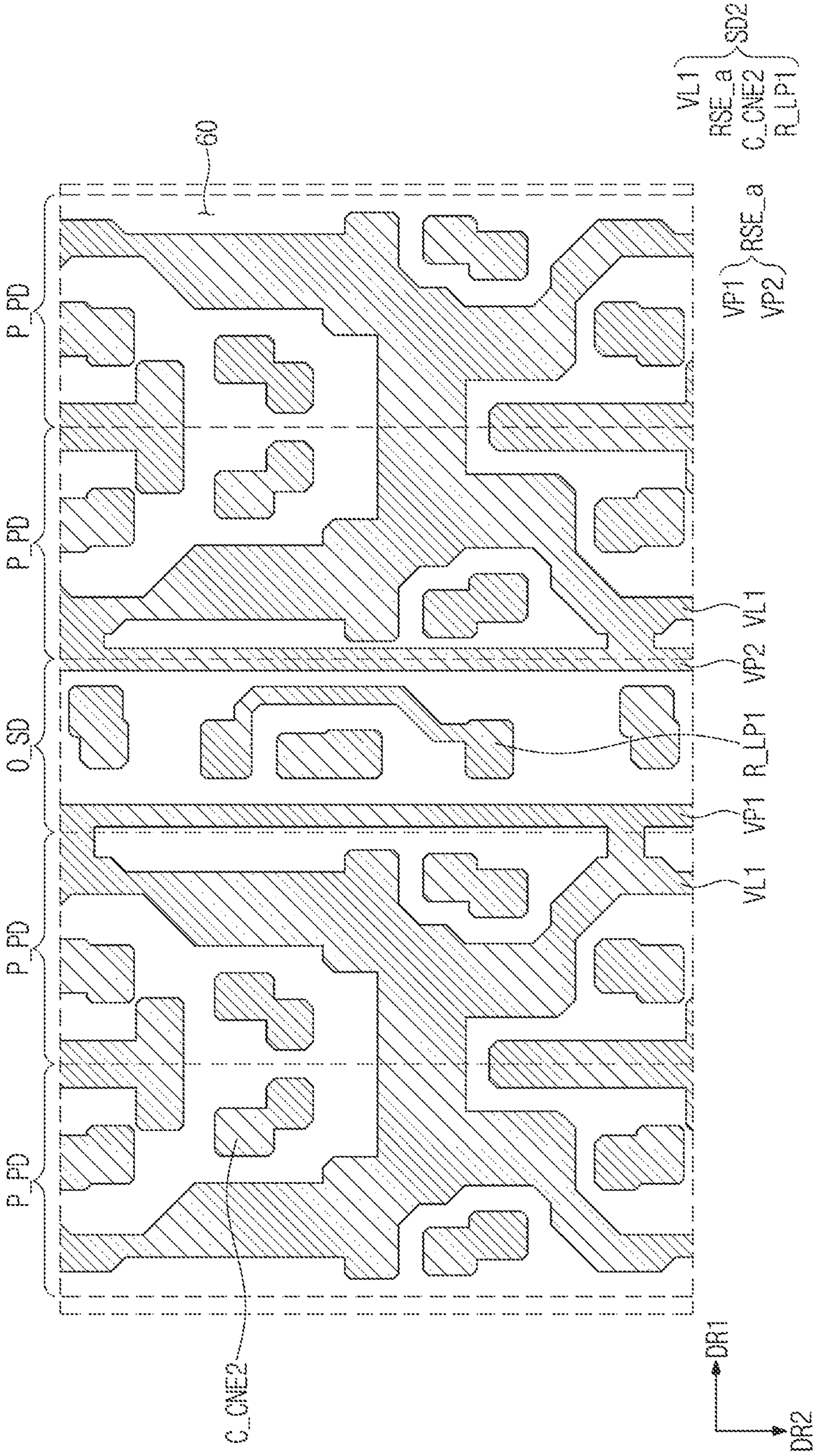
FIG. 10B is a plan view illustrating the second data pattern layer according to some embodiments of the present disclosure.
Figure 11:
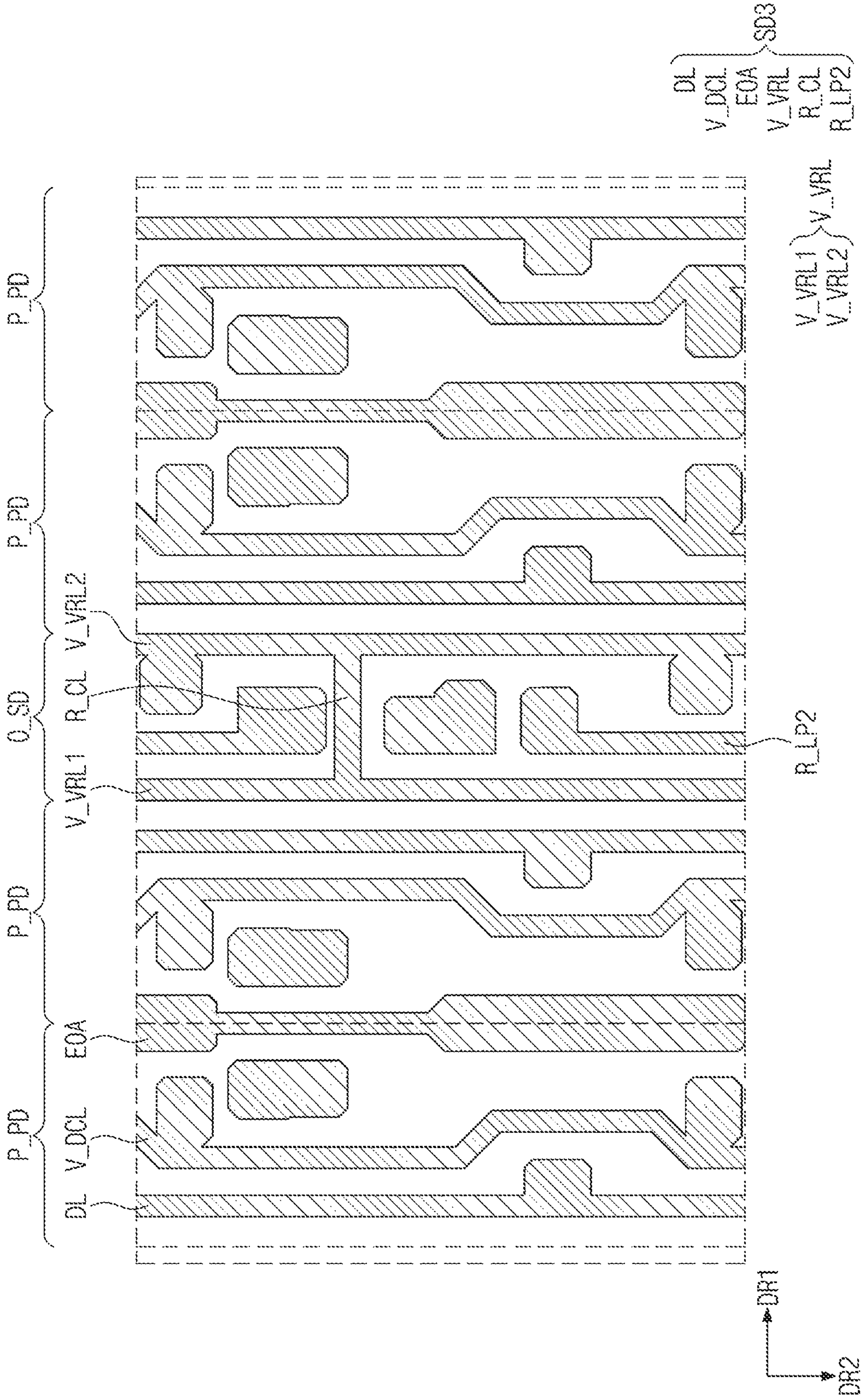
FIG. 11 is a plan view illustrating a third data pattern layer illustrated in FIG. 8.

FIG. 8 is an enlarged plan view illustrating a portion of the display panel according to some embodiments of the present disclosure. FIG. 9 is a plan view illustrating a first data pattern layer illustrated in FIG. 8. FIG. 10A is a plan view illustrating a second data pattern layer illustrated in FIG. 8. FIG. 10B is a plan view illustrating the second data pattern layer according to some embodiments of the present disclosure. FIG. 11 is a plan view illustrating a third data pattern layer illustrated in FIG. 8.

Referring to FIGS. 8 to 11, the conductive patterns may be repeatedly arranged in a rule (e.g., a set or predetermined rule) in a plan view. FIGS. 8 to 11 illustrate some of the pixel driving circuits P_PD and some of the sensor driving circuits O_SD.

FIG. 8 is a plan view illustrating first to third data pattern layers SD1, SD2, and SD3 arranged on different layers above the fifth insulating layer 50 illustrated in FIG. 6. The first data pattern layer SD1 is located on the fifth insulating layer 50, the second data pattern layer SD2 is located on the sixth insulating layer 60, and the third data pattern layer SD3 is located on the seventh insulating layer 70.

Referring to FIGS. 8 and 9, the fifth insulating layer 50 may be located on the fourth insulating layer 40 illustrated in FIG. 6. The first data pattern layer SD1 is located on the fifth insulating layer 50. The first data pattern layer SD1 may include, for example, a metal, an alloy, a conductive metal oxide, a transparent conductive material, or the like. Hereinafter, for convenience of description, FIG. 8 illustrates only some of components included in the first data pattern layer SD1.

The first data pattern layer SD1 may include a horizontal reset voltage line H_VRL, the bias voltage line VBL, the first initialization voltage line VIL, and a plurality of first connection electrode patterns C_CNE1.

The horizontal reset voltage line H_VRL, the bias voltage line VBL, and the first initialization voltage line VIL may extend in the first direction DR1. The horizontal reset voltage line H_VRL, the bias voltage line VBL, and the first initialization voltage line VIL may be spaced apart from each other in the second direction DR2.

The horizontal reset voltage line H_VRL may be included in the reset voltage line VRL of FIG. 4A. The reset voltage Vrst (see FIG. 4A) may be provided to the horizontal reset voltage line H_VRL. The horizontal reset voltage line H_VRL may be electrically connected to the reset transistor ST1. The reset transistor ST1 may receive the reset voltage Vrst through the horizontal reset voltage line H_VRL. The bias voltage line VBL may correspond to the bias voltage line VBL of FIG. 4A. The bias voltage Vbias (see FIG. 4A) may be provided to the bias voltage line VBL. The bias voltage line VBL may be connected to the eighth transistor T8 through a contact portion. The eighth transistor T8 may receive the bias voltage Vbias through the bias voltage line VBL.

The first initialization voltage line VIL may correspond to the first initialization voltage line VIL of FIG. 4A. The first initialization voltage Vint (see FIG. 4A) may be provided to the first initialization voltage line VIL. The first initialization voltage line VIL may be connected to the fourth transistor T4 through a contact portion. The fourth transistor T4 may receive the first initialization voltage Vint through the first initialization voltage line VIL.

The plurality of first connection electrode patterns C_CNE1 may include the first and third connection electrodes CNE10 and CNE11 illustrated in FIG. 6.

The first data pattern layer SD1 may further include the horizontal data connection lines H_DCL. The horizontal data connection lines H_DCL may correspond to the horizontal data connection lines H_DCL illustrated in FIG. 5.

Referring to FIGS. 8 and 10A, the sixth insulating layer 60 may cover at least a portion of the first data pattern layer SD1 and may be located on the fifth insulating layer 50. The second data pattern layer SD2 may be located on the sixth insulating layer 60. The second data pattern layer SD2 may include, for example, a metal, an alloy, a conductive metal oxide, a transparent conductive material, or the like.

The second data pattern layer SD2 includes the first driving voltage line VL1, the shielding electrode wiring RSE, a first line part R_LP1 of the read-out wiring RL, and a plurality of second connection electrode patterns C_CNE2

The first driving voltage line VL1 may overlap the pixel driving circuit P_PD, and the shielding electrode wiring RSE may overlap the sensor driving circuit O_SD. The first driving voltage line VL1 may correspond to the first driving voltage line VL1 of FIG. 4A. The first driving voltage ELVDD (see FIG. 4A) may be provided to the first driving voltage line VL1. The first driving voltage line VL1 may be located in a mesh shape inside the display area DA (see FIG. 3) of the display panel DP. The first driving voltage line VL1 may be connected to the fifth transistor T5 and the capacitor Cst illustrated in FIG. 4A through a contact portion.

The shielding electrode wiring RSE is located on the sixth insulating layer 60 together with the first driving voltage line VL1. The shielding electrode wiring RSE includes a first vertical part VP1, a second vertical part VP2, and a horizontal part HP. The first and second vertical parts VP1 and VP2 extend in the second direction DR2 and are spaced apart from each other in the first direction DR1. One side of the first vertical part VP1 extends from the first driving voltage line VL1, and one side of the second vertical part VP2 extends from the first driving voltage line VL1. That is, the first and second vertical parts VP1 and VP2 may be formed integrally with the first driving voltage line VL1. Thus, the first driving voltage ELVDD (illustrated in FIG. 4A) applied to the first driving voltage line VL1 may be applied to the shielding electrode wiring RSE.

The horizontal part HP extends in the first direction DR1 and connects the first and second vertical parts VP1 and VP2. The first and second vertical parts VP1 and VP2 may be electrically connected to each other by the horizontal part HP. A first end of the horizontal part HP extends from the first vertical part VP1, and a second end of the horizontal part HP extends from the second vertical part VP2. As an example of the present disclosure, the horizontal part HP may have an integral shape with the first and second vertical parts VP1 and VP2. Alternatively, the horizontal part HP may be located on a different layer from those of the first and second vertical parts VP1 and VP2 and connected to the first and second vertical parts VP1 and VP2 through a contact hole.

As illustrated in FIG. 10A, the shielding electrode wiring RSE has a structure extending from the first driving voltage line VL1 (i.e., an integral structure), and thus the first driving voltage line VL1 may form a mesh structure by the shielding electrode wiring RSE. As the first driving voltage line VL1 is formed in the entire display area DA (see FIG. 3) in the mesh structure, the first driving voltage ELVDD may be uniformly supplied to the entire display area DA.

The shielding electrode wiring RSE may have a closed curve shape in which the horizontal part HP and the first and second vertical parts VP1 and VP2 are connected to each other to surround the sensor driving circuit O_SD in a plan view. However, the structure of the shielding electrode wiring RSE is not limited thereto. Alternatively, as illustrated in FIG. 10B, in a shielding electrode wiring RSE_a, the horizontal part HP may be omitted.

The read-out wiring RL may correspond to one of the read-out lines RL1 to RLh illustrated in FIG. 3. The read-out wiring RL may be connected to the sensor driving circuit O_SD (particularly, the output transistor ST3) illustrated in FIG. 4A. The first line part R_LP1 of the read-out wiring RL may be located between the first vertical part VP1 and the second vertical part VP2. The first line part R_LP1 may not overlap the shielding electrode wiring RSE. That is, the first line part R_LP1 may be spaced apart from the first and second vertical parts VP1 and VP2 in the first direction DR1 and may be spaced apart from the horizontal part HP in the second direction DR2. As an example of the present disclosure, the first line part R_LP1 may have a shape extending in the first direction DR1.

The second data pattern layer SD2 may further include the plurality of second connection electrode patterns C_CNE2. The plurality of second connection electrode patterns C_CNE2 may include the second and fourth connection electrodes CNE20 and CNE21 illustrated in FIG. 6.

Referring to FIGS. 8 and 11, the seventh insulating layer 70 may cover at least a portion of the second data pattern layer SD2 and may be located on the sixth insulating layer 60. The third data pattern layer SD3 may be located on the seventh insulating layer 70. The third data pattern layer SD3 may include, for example, a metal, an alloy, a conductive metal oxide, a transparent conductive material, or the like.

The third data pattern layer SD3 may include the data wiring DL, the vertical data connection line V_DCL, a vertical reset voltage line V_VRL, a vertical driving voltage line EOA, a second line part R_LP2 of the read-out wiring RL, and a plurality of third connection electrode patterns C_CNE3.

The data wiring DL, the vertical data connection line V_DCL, the vertical reset voltage line V_VRL, and the vertical driving voltage line EOA may extend in the second direction DR2. The data wiring DL, the vertical data connection line V_DCL, the vertical reset voltage line V_VRL, and the vertical driving voltage line EOA may be spaced apart from each other in the first direction DR1.

The data wiring DL may correspond to one of the data lines DL1 to DLm illustrated in FIG. 3. The data wiring DL may be connected to the pixel driving circuit P_PD (particularly, the second transistor T2) illustrated in FIG. 4A. The vertical data connection line V_DCL may correspond to the vertical data connection line V_DCL illustrated in FIG. 5. The vertical data connection line V_DCL may be electrically connected to the horizontal data connection line H_DCL illustrated in FIG. 9.

The vertical reset voltage line V_VRL is located on a different layer from that of the horizontal reset voltage line H_VRL illustrated in FIG. 9, but the vertical reset voltage line V_VRL and the horizontal reset voltage line H_VRL may be connected to each other through a contact hole. That is, the vertical reset voltage line V_VRL may constitute a portion of the reset voltage line VRL illustrated in FIG. 4A. The reset voltage line VRL may have a mesh shape by the vertical reset voltage line V_VRL and the horizontal reset voltage line H_VRL. As an example of the present disclosure, the vertical reset voltage line V_VRL includes a first vertical reset voltage line V_VRL1 located on a first side of the sensor driving circuit O_SD and a second vertical reset voltage line V_VRL2 located on a second side of the sensor driving circuit O_SD.

As an example of the present disclosure, the first vertical reset voltage line V_VRL1 overlaps the first vertical part VP1 of the shielding electrode wiring RSE, and the second vertical reset voltage line V_VRL2 overlaps the second vertical part VP2 of the shielding electrode wiring RSE. The shielding electrode wiring RSE is located on a different layer from those of the first and second vertical reset voltage lines V_VRL1 and V_VRL2, and thus the shielding electrode wiring RSE and the first and second vertical reset voltage lines V_VRL1 and V_VRL2 may overlap each other in a plan view. That is, the first vertical part VP1 may overlap the first vertical reset voltage line V_VRL1, and the second vertical part VP2 may overlap the second vertical reset voltage line V_VRL2.

The reset voltage line VRL may further include a connection line R_CL connecting the first and second vertical reset voltage lines V_VRL1 and V_VRL2. The connection line R_CL is located between the first and second vertical reset voltage lines V_VRL1 and V_VRL2. A first end of the connection line R_CL extends from the first vertical reset voltage line V_VRL1, and a second end of the connection line R_CL extends from the second vertical reset voltage line V_VRL2. As an example of the present disclosure, the connection line R_CL may have an integral shape with the first and second vertical reset voltage lines V_VRL1 and V_VRL2.

The vertical driving voltage line EOA may be connected to one of the first initialization voltage line VIL (refer to FIG. 4A), the second initialization voltage line VAIL (refer to FIG. 4A), and the second driving voltage line VL2 (refer to FIG. 4A). The vertical driving voltage line EOA may be provided as a plurality, and the plurality of vertical driving voltage lines EOA may be spaced apart from each other in the first direction DR1. As an example of the present disclosure, some (or a first group) of the plurality of vertical driving voltage lines EOA may be connected to the first initialization voltage line VIL, some (or a second group) thereof may be connected to the second initialization voltage line VAIL, and the remaining ones (or a third group) thereof may be connected to the second driving voltage line VL2. The first to third groups of the vertical driving voltage lines EOA may be electrically isolated from each other.

The first initialization voltage line VIL, the second initialization voltage line VAIL, and the second driving voltage line VL2 may be arranged on the display area DA (see FIG. 3) in a mesh structure by the vertical driving voltage lines EOA. Thus, a voltage may be uniformly supplied to the entire display area DA (see FIG. 3) of the display panel DP.

The plurality of third connection electrode patterns C_CNE3 may include the fifth connection electrode CNE30 and the sixth connection electrode CNE31 illustrated in FIG. 6.

The second line part R_LP2 of the read-out wiring RL may be located between the first vertical reset voltage line V_VRL1 and the second vertical reset voltage line V_VRL2. The second line part R_LP2 may not overlap the vertical reset voltage line V_VRL in a plan view. That is, the second line part R_LP2 may be spaced apart from the first vertical reset voltage line V_VRL1 and the second vertical reset voltage line V_VRL2 in the first direction DR1 and may be spaced apart from the connection line R_CL in the second direction DR2.

As an example of the present disclosure, the second line part R_LP2 may have a shape extending in the first direction DR1. The second line part R_LP2 may be connected to the first line part R_LP1 illustrated in FIG. 10A. Thus, the read-out wiring RL may be provided in a configuration in which the first and second line parts R_LP1 and R_LP2 are coupled.

FIGS. 10A to 11 illustrate an example structure in which the read-out wiring RL includes the first line part R_LP1 and the second line part R_LP2, but embodiments according to the present disclosure are not limited thereto. For example, the read-out wiring RL may include only a portion located on one of the sixth insulating layer 60 and the seventh insulating layer 70.

Referring back to FIG. 8, the shielding electrode wiring RSE may be located between the read-out wiring RL and the data wiring DL in a plan view. The shielding electrode wiring RSE receives a DC voltage (i.e., the first driving voltage ELVDD) having a constant potential from the first driving voltage line VL1. Thus, the shielding electrode wiring RSE may function to shield a detection signal output from the read-out wiring RL such that the detection signal is not coupled by a data signal. Thus, sensing accuracy of the sensor FX (see FIG. 3) may be improved.

Figure 12A:
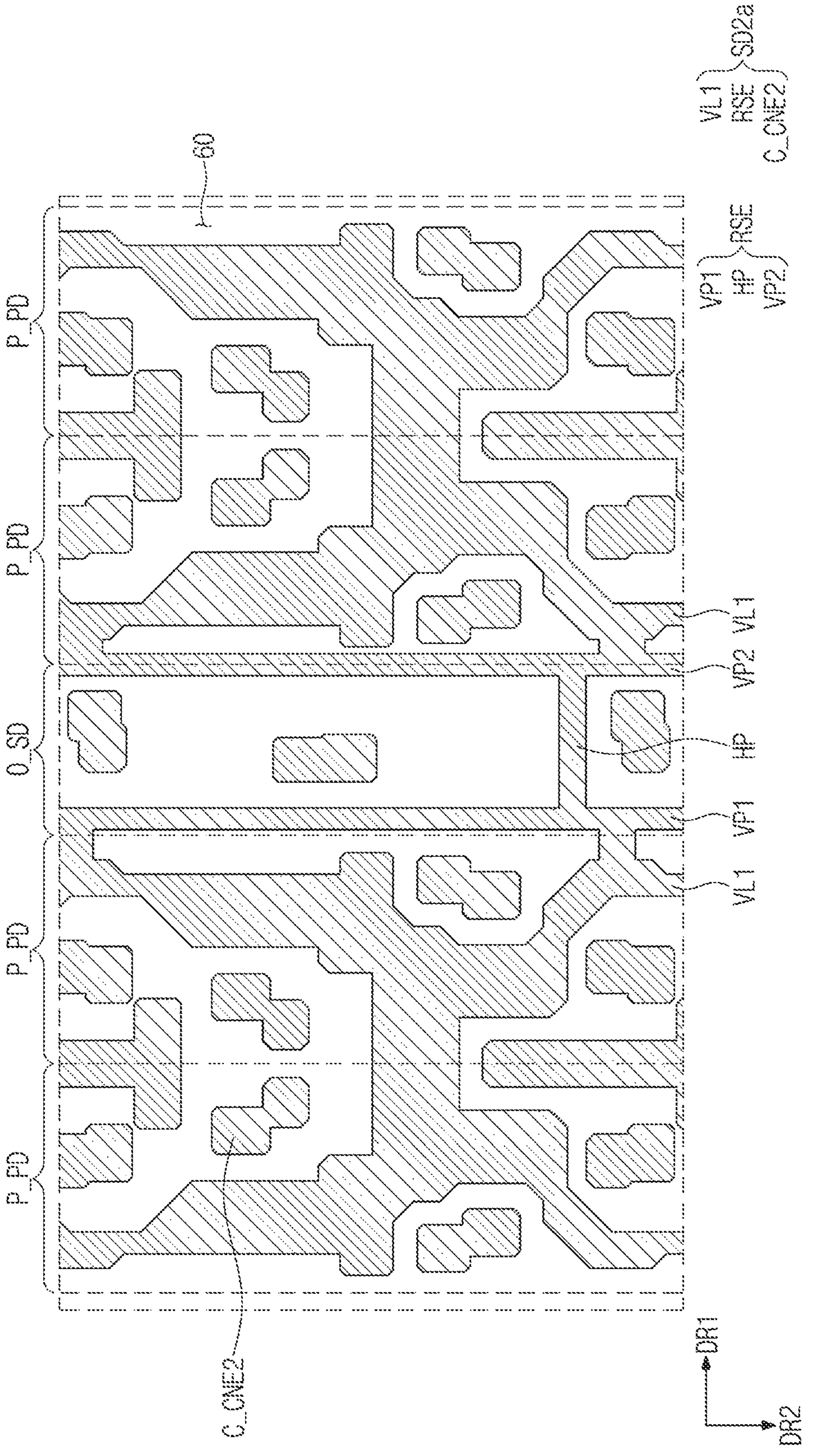
FIG. 12A is a view illustrating the second data pattern layer according to some embodiments of the present disclosure.
Figure 12B:
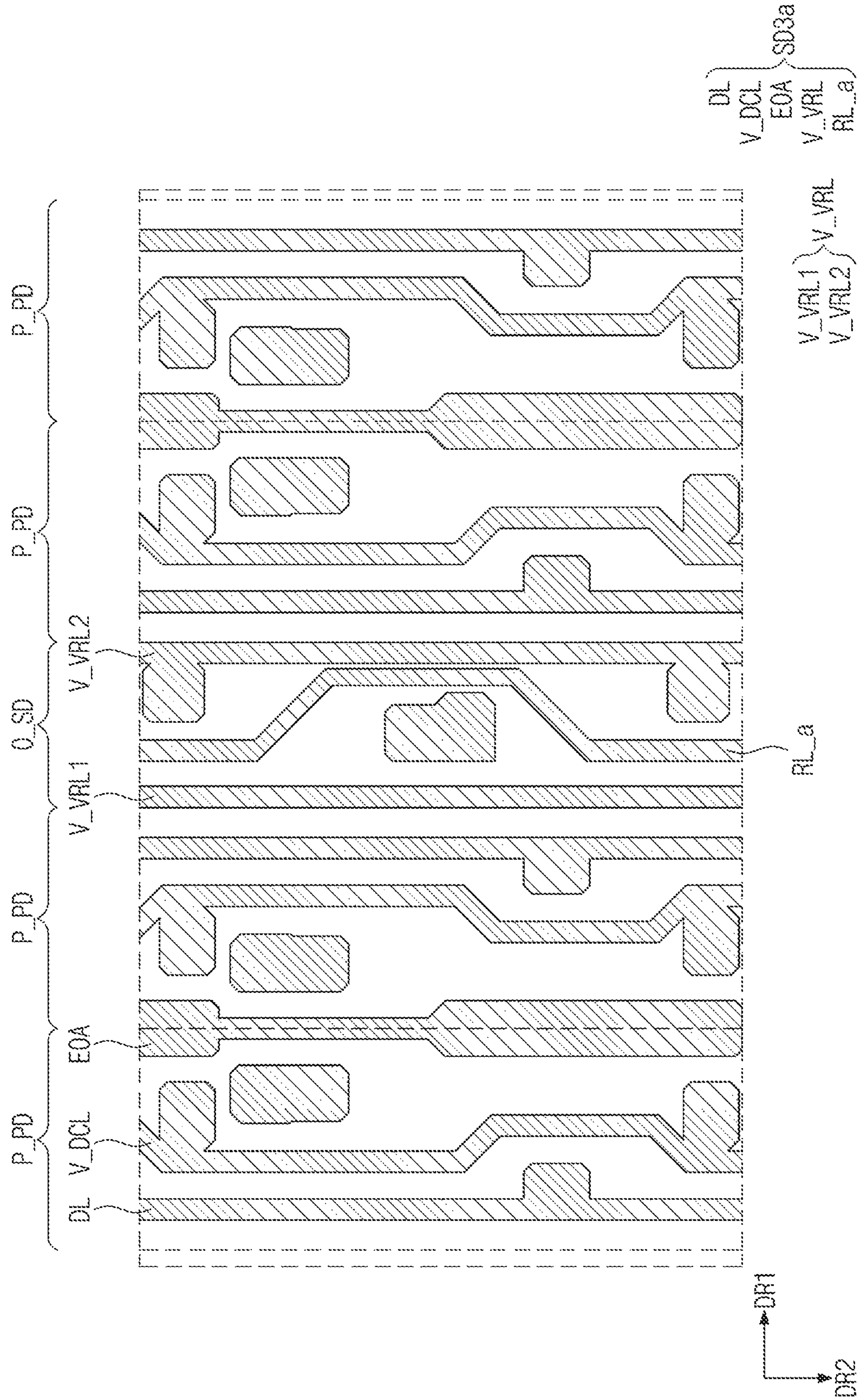
FIG. 12B is a view illustrating the third data pattern layer according to some embodiments of the present disclosure.

FIG. 12A is a view illustrating the second data pattern layer according to some embodiments of the present disclosure. FIG. 12B is a view illustrating the third data pattern layer according to some embodiments of the present disclosure.

Referring to FIG. 12A, a second data pattern layer SD2*a* may include the first driving voltage line VL1, the shielding electrode wiring RSE, and the second connection electrode pattern C_CNE2. As compared to the second data pattern layer SD2 illustrated in FIG. 10A, the second data pattern layer SD2*a* may not include the first line part R_LP1 (illustrated in FIG. 10B) of the read-out wiring RL.

Referring to FIG. 12B, a third data pattern layer SD3*a* may include the data wiring DL, the vertical data connection line V_DCL, the vertical reset voltage line V_VRL, the vertical driving voltage line EOA, a read-out wiring RL_a, and the plurality of third connection electrode patterns C_CNE3.

As compared to the third data pattern layer SD3 illustrated in FIG. 11, the third data pattern layer SD3*a* may include the read-out wiring RL_a. The read-out wiring RL_a may extend in the second direction DR2 along the first or second vertical reset voltage line V_VRL1 or V_VRL2. In this case, the reset voltage line VRL may not include the connection line R_CL (see FIG. 11) connecting the first and second vertical reset voltage lines V_VRL1 and V_VRL2.

FIGS. 12A and 12B illustrate a configuration in which the read-out wiring RL_a is only included in the third data pattern layer SD3*a*, but embodiments according to the present disclosure are not limited thereto. The read-out wiring RL_a may only be included in the second data pattern layer SD2. In this case, the read-out wiring RL_a may extend along the first or second vertical part VP1 or VP2, and the horizontal part HP in the shielding electrode wiring RSE may be omitted.

Figure 13A:
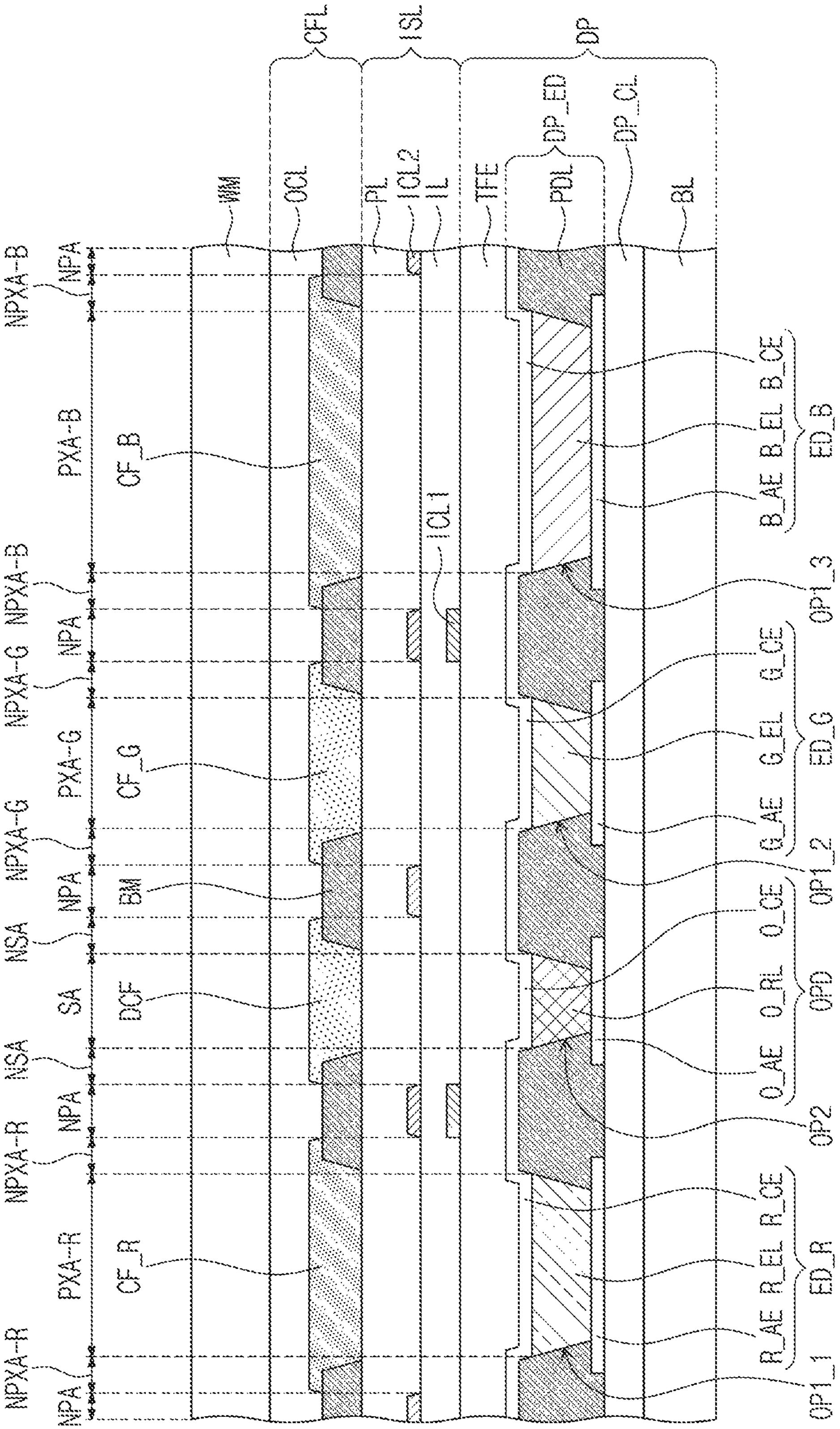
FIGS. 13A and 13B are cross-sectional views illustrating a light emitting element and a light receiving element of the display panel according to some embodiments of the present disclosure.
Figure 13B:
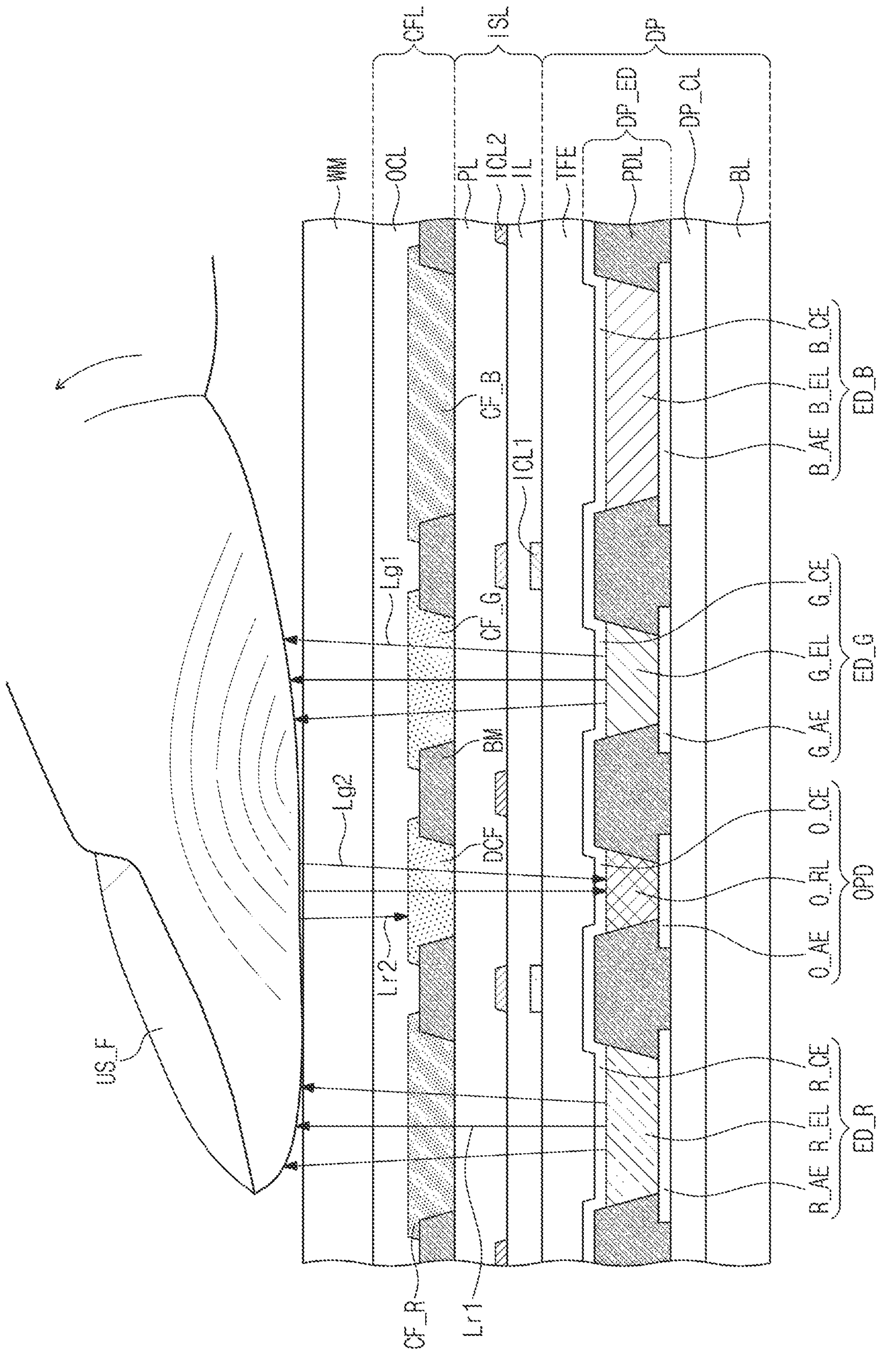

FIGS. 13A and 13B are cross-sectional views illustrating a light emitting element and a light receiving element of the display panel according to some embodiments of the present disclosure.

Referring to FIGS. 13A and 13B, a first electrode layer is located on the circuit layer DP_CL. The pixel definition film PDL is formed on the first electrode layer. The first electrode layer may include red, green, and blue anode electrodes R_AE, G_AE, and B_AE. First to third light emitting openings OP1_1, OP1_2, and OP1_3 of the pixel definition film PDL expose at least portions of the red, green, and blue anode electrodes R_AE, G_AE, and B_AE, respectively. According to some embodiments of the present disclosure, the pixel definition film PDL may further include a black material. The pixel definition film PDL may further include a black organic dye/pigment such as carbon black or aniline black. The pixel definition film PDL may be formed by mixing a blue organic material and a black organic material. The pixel definition film PDL may further include a liquid-repellent organic material.

As illustrated in FIG. 13A, the display panel DP may include first to third light emitting areas PXA-R, PXA-G, and PXA-B and first to third non-light emitting areas NPXA-R, NPXA-G, and NPXA-B adjacent to the first to third light emitting areas PXA-R, PXA-G, and PXA-B. The non-light emitting areas NPXA-R, NPXA-G, and NPXA-B may surround the corresponding light emitting areas PXA-R, PXA-G, and PXA-B, respectively. According to some embodiments, the first light emitting area PXA-R is defined to correspond to a partial area of the red anode electrode R_AE exposed by the first light emitting opening OP1_1. The second light emitting area PXA-G is defined to correspond to a partial area of the green anode electrode G_AE exposed by the second light emitting opening OP1_2. The third light emitting area PXA-B is defined to correspond to a partial area of the blue anode electrode B_AE exposed by the third light emitting opening OP1_3. A non-pixel area NPA may be defined between the first to third non-light emitting areas NPXA-R, NPXA-G, and NPXA-B.

A light emitting layer may be located on the first electrode layer. The light emitting layer may include red, green, and blue light emitting layers R_EL, G_EL, and B_EL. The red, green, and blue light emitting layers R_EL, G_EL, and B_EL may be arranged in corresponding areas of the first to third light emitting openings OP1_1, OP1_2, and OP1_3, respectively. The red, green, and blue light emitting layers R_EL, G_EL, and B_EL may be formed to be separated from each other. The red, green, and blue light emitting layers R_EL, G_EL, and B_EL may include an organic material and/or an inorganic material. The red, green, and blue light emitting layers R_EL, G_EL, and B_EL may generate light beams having colors (e.g., set or predetermined colors). For example, the red light emitting layer R_EL may generate a red light beam, the green light emitting layer G_EL may generate a green light beam, and the blue light emitting layer B_EL may generate a blue light beam.

According to some embodiments, the patterned red, green, and blue light emitting layers R_EL, G_EL, and B_EL are illustrated according to some embodiments, but one light emitting layer may be commonly arranged in the first to third light emitting areas PXA-R, PXA-G, and PXA-B. In this case, the light emitting layer may generate a white light beam or a blue light beam. Further, the light emitting layer may have a multi-layer structure that is referred to as a tandem.

The red, green, and blue light emitting layers R_EL, G_EL, and B_EL may include a low molecular organic material or a high molecular organic material as a light emitting material. Alternatively, the red, green, and blue light emitting layers R_EL, G_EL, and B_EL may include a quantum dot material as a light emitting material. A core of a quantum dot may be selected from a group II-VI compound, a group III-V compound, a group IV-VI compound, a group IV element, a group IV compound, and combinations thereof.

A second electrode layer is located on the red, green, and blue light emitting layers R_EL, G_EL, and B_EL. The second electrode layer may include red, green, and blue cathode electrodes R_CE, G_CE, and B_CE. The red, green, and blue cathode electrodes R_CE, G_CE, and B_CE may be electrically connected to each other. As an example of the present disclosure, the red, green, and blue cathode electrodes R_CE, G_CE, and B_CE may have an integral shape. In this case, the red, green, and blue cathode electrodes R_CE, G_CE, and B_CE may be commonly arranged in the first to third light emitting areas PXA-R, PXA-G, and PXA-B, the first to third non-light emitting areas NPXA-R, NPXA-G, and NPXA-B, and the non-pixel area NPA.

The element layer DP_ED may further include the light receiving element OPD. The light receiving element OPD may be a photodiode. The pixel definition film PDL may further include the light receiving opening OP2 provided to correspond to the light receiving element OPD.

The light receiving element OPD may include a sensing anode electrode O_AE, the photoelectric conversion layer O_RL, and a sensing cathode electrode O_CE. The sensing anode electrode O_AE may be located on the same layer as that of the first electrode layer. That is, the sensing anode electrode O_AE may be located on the circuit layer DP_CL and may be simultaneously formed through the same process as those of the red, green, and blue anode electrodes R_AE, G_AE, and B_AE.

The light receiving opening OP2 of the pixel definition film PDL exposes at least a portion of the sensing anode electrode O_AE. The photoelectric conversion layer O_RL is located on the sensing anode electrode O_AE exposed by the light receiving opening OP2. The photoelectric conversion layer O_RL may include an organic photo-sensing material. The sensing cathode electrode O_CE may be located on the photoelectric conversion layer O_RL. The sensing cathode electrode O_CE may be simultaneously formed through the same process as those of the red, green, and blue cathode electrodes R_CE, G_CE, and B_CE. As an example of the present disclosure, the sensing cathode electrode O_CE may have a shape integral with the red, green, and blue cathode electrodes R_CE, G_CE, and B_CE, thereby forming the common cathode electrode C_CE (see FIG. 6).

The encapsulation layer TFE is located on the element layer DP_ED. The encapsulation layer TFE includes at least an inorganic layer or an organic layer. According to some embodiments of the present disclosure, the encapsulation layer TFE may include two inorganic layers and an organic layer located therebetween. According to some embodiments of the present disclosure, the encapsulation layer TFE may include a plurality of inorganic layers and a plurality of organic layers that are alternately laminated.

The inorganic layer protects red, green, and blue light emitting elements ED_R, ED_G, and ED_B and the light receiving element OPD from moisture/oxygen, and the organic layer protects the red, green, and blue light emitting elements ED_R, ED_G, and ED_B and the light receiving element OPD from foreign substances such as dust particles. The inorganic layer may include a silicon nitride layer, a silicon oxy nitride layer, a silicon oxide layer, a titanium oxide layer, an aluminum oxide layer, or the like, but embodiments according to the present disclosure are not particularly limited thereto. The organic layer may include an acryl-based organic layer, but embodiments according to the present disclosure are not particularly limited thereto.

The display device DD includes the input detection layer ISL located on the display panel DP and the color filter layer CFL located on the input detection layer ISL.

The input detection layer ISL may be directly located on the encapsulation layer TFE. The input detection layer ISL includes a first conductive layer ICL1, an insulating layer IL, a second conductive layer ICL2, and a protective layer PL. The first conductive layer ICL1 may be located on the encapsulation layer TFE. FIGS. 13A and 13B illustrate a structure in which the first conductive layer ICL1 is directly located on the encapsulation layer TFE, but embodiments according to the present disclosure are not particularly limited thereto. The input detection layer ISL may further include a base insulating layer located between the first conductive layer ICL1 and the encapsulation layer TFE. In this case, the encapsulation layer TFE may be covered by the base insulating layer, and the first conductive layer ICL1 may be located on the base insulating layer. As an example of the present disclosure, the base insulating layer may include an inorganic insulating material.

The insulating layer IL may cover the first conductive layer ICL1. The second conductive layer ICL2 is located on the insulating layer IL. A structure in which the input detection layer ISL includes the first and second conductive layers ICL1 and ICL2 is illustrated, but embodiments according to the present disclosure are not particularly limited thereto. For example, the input detection layer ISL may include only one of the first and second conductive layers ICL1 and ICL2.

The protective layer PL may be located on the second conductive layer ICL2. The protective layer PL may include an organic insulating material. The protective layer PL may serve to protect the first and second conductive layers ICL1 and ICL2 from moisture/oxygen and protect the first and second conductive layers ICL1 and ICL2 from foreign substances.

The color filter layer CFL may be located on the input detection layer ISL. The color filter layer CFL may be directly located on the protective layer PL. The color filter layer CFL may include a first color filter CF_R, a second color filter CF_G, and a third color filter CF_B. The first color filter CF_R has a first color, the second color filter CF_G has a second color, and the third color filter CF_B has a third color. As an example of the present disclosure, the first color may be red, the second color may be green, and the third color may be blue.

The color filter layer CFL may further include a dummy color filter DCF. As an example of the present disclosure, when an area in which the photoelectric conversion layer O_RL is located is defined as a sensing area SA, and when an area around the sensing area SA is defined as a non-sensing area NSA, the dummy color filter DCF may be arranged to correspond to the sensing area SA. The dummy color filter DCF may overlap the sensing area SA and the non-sensing area NSA. As an example of the present disclosure, the dummy color filter DCF may have the same color as that of one of the first to third color filters CF_R, CF_G, and CF_B. As an example of the present disclosure, the dummy color filter DCF may have a green color that is equal to the color of the second color filter CF_G.

The color filter layer CFL may further include a black matrix BM. The black matrix BM may be arranged to correspond to the non-pixel area NPA. The black matrix BM may be arranged to overlap the first and second conductive layers ICL1 and ICL2 in the non-pixel area NPA. As an example of the present disclosure, the black matrix BM may overlap the non-pixel area NPA and the first to third non-light emitting areas NPXA-R, NPXA-G, and NPXA-B. The black matrix BM may not overlap the first to third light emitting areas PXA-R, PXR-G, and PXA-B.

The color filter layer CFL may further include an overcoating layer OCL. The overcoating layer OCL may include an organic insulating material. The overcoating layer OCL may be provided to have a thickness sufficient to remove a step difference between the first to third color filters CF_R, CF_G, and CF_B. The overcoating layer OCL may include any material as long as the material may flatten an upper surface of the color filter layer CFL while having a thickness (e.g., a set or predetermined thickness) without being particularly limited, and may include, for example, an acrylate-based organic material.

Referring to FIG. 13B, when the display device DD (see FIG. 1) operates, the red, green, and blue light emitting elements ED_R, ED_G, and ED_B may output light beams. The red light emitting element ED_R outputs a red light beam in a red wavelength band, the green light emitting element ED_G outputs a green light beam in a green wavelength band, and the blue light emitting element ED_B outputs a blue light beam in a blue wavelength band.

As an example of the present disclosure, the light receiving element OPD may receive a light beam from specific light emitting elements (e.g., the green light emitting elements ED_G) among the red, green, and blue light emitting elements ED_R, ED_G, and ED_B. That is, the light receiving element OPD may receive a second reflected light beam Lg2 obtained by reflecting a second light beam Lg1 output from the green light emitting elements ED_G by the fingerprint of the user. The second light beam Lg1 and the second reflected light beam Lg2 may be green light beams in a green wavelength range. The dummy color filter DCF is located above the light receiving element OPD. The dummy color filter DCF may have a green color. Thus, the second reflected light beam Lg2 may pass through the dummy color filter DCF and may be input to the light receiving element OPD.

Meanwhile, the red light beams and the blue light beams output from the red and blue light emitting elements ED_R and ED_B may also be reflected by the hand US_F of the user. For example, when light beams obtained by reflecting red light beams Lr1 output from the red light emitting elements ED_R by the hand US_F of the user are defined as first reflected light beams Lr2, the first reflected light beams Lr2 may be absorbed without passing through the dummy color filter DCF. Thus, the first reflected light beam Lr2 may not pass through the dummy color filter DCF and thus may not be input to the light receiving element OPD. Likewise, even when the blue light beam is reflected by the hand US_F of the user, the blue light beam may be absorbed by the dummy color filter DCF. Thus, only the second reflected light beam Lg2 may be provided to the light receiving element OPD.

As described above, because a shielding electrode wiring has a structure (i.e., an integral structure) extending from a first driving voltage line, the first driving voltage line may form a mesh structure by the shielding electrode wiring. As the first driving voltage line is formed in a display area in the mesh structure, a first driving voltage may be uniformly supplied to the entire display area.

Further, the shielding electrode wiring receives a direct current (DC) voltage (i.e., the first driving voltage) having a constant potential from the first driving voltage line. Thus, the shielding electrode wiring may function to shield a detection signal output from a read-out wiring such that the detection signal is not coupled by a data signal, and as a result, sensing accuracy of a sensor provided on a display panel may be improved.

Although the description has been made above with reference to aspects of some embodiments of the present disclosure, it may be understood that those skilled in the art or those having ordinary knowledge in the art may variously modify and changes the present disclosure without departing from the spirit and technical scope of the present disclosure described in the appended claims. Accordingly, the technical scope of the present disclosure is not limited to the detailed description of the specification, but should be defined by the appended claims, and their equivalents.

What is claimed is:

1. A display device comprising:

a base layer in which a display area and a non-display area are defined;

a circuit layer on the base layer; and an element layer on the circuit layer and including a light emitting element and a light receiving element corresponding to the display area, wherein the circuit layer includes:

a pixel driving circuit connected to the light emitting element;

a sensor driving circuit connected to the light receiving element;

a read-out line connected to the sensor driving circuit;

a data line connected to the pixel driving circuit;

a driving voltage line connected to the pixel driving circuit;

a reset voltage line connected to the sensor driving circuit; and a shielding electrode wiring electrically connected to the driving voltage line and overlapping the reset voltage line.

2. The display device of claim 1, wherein the reset voltage line includes:

a horizontal reset voltage line extending in a first direction; and a vertical reset voltage line extending in a second direction intersecting the first direction and connected to the horizontal reset voltage line, and the shielding electrode wiring at least overlaps the vertical reset voltage line.

3. The display device of claim 2, wherein the horizontal reset voltage line and the vertical reset voltage line are arranged in different layers.

4. The display device of claim 3, wherein the shielding electrode wiring is in a different layer from those of the horizontal reset voltage line and the vertical reset voltage line.

5. The display device of claim 4, wherein the driving voltage line and the shielding electrode wiring are arranged on a same layer, and the shielding electrode wiring extends from the driving voltage line.

6. The display device of claim 2, wherein the vertical reset voltage line includes:

a first vertical reset voltage line on a first side of the sensor driving circuit; and a second vertical reset voltage line on a second side of the sensor driving circuit, and the reset voltage line further includes a connection line that connects the first vertical reset voltage line and the second vertical reset voltage line.

7. The display device of claim 6, wherein the shielding electrode wiring includes:

a first vertical part overlapping the first vertical reset voltage line;

a second vertical part overlapping the second vertical reset voltage line; and a horizontal part that connects the first vertical part and the second vertical part.

8. The display device of claim 7, wherein the shielding electrode wiring has a closed curve shape in which the horizontal part, the first vertical part, and the second vertical part are connected to each other to surround the sensor driving circuit in a plan view.

9. The display device of claim 2, wherein the read-out line includes:

a first line part not overlapping the shielding electrode wiring in a plan view; and a second line part overlapping the shielding electrode wiring in the plan view and connected to the first line part, and the second line part is on a different layer from that of the shielding electrode wiring.

10. The display device of claim 9, wherein the first line part and the shielding electrode wiring are on a same layer, and the second line part and the vertical reset voltage line are arranged on a same layer.

11. The display device of claim 2, wherein the data line and the vertical reset voltage line are on a same layer.

12. The display device of claim 1, wherein the sensor driving circuit includes:

a reset transistor including a first electrode configured to receive a reset voltage, a second electrode connected to a first sensing node, and a third electrode configured to receive a reset control signal;

an amplification transistor including a first electrode configured to receive a sensor driving voltage, a second electrode connected to the first sensing node, and a third electrode connected to a second sensing node; and an output transistor including a first electrode connected to the second sensing node, a second electrode connected to the read-out line, and a third electrode configured to receive an output control signal.

13. The display device of claim 12, wherein the reset voltage line is connected to the first electrode of the reset transistor to apply the reset voltage.

14. The display device of claim 12, wherein the circuit layer further includes:

a first initialization voltage line connected to the pixel driving circuit to apply a first initialization voltage; and a second initialization voltage line connected to the pixel driving circuit to apply a second initialization voltage.

15. The display device of claim 14, wherein the second initialization voltage line is connected to the first electrode of the amplification transistor to apply the second initialization voltage as the sensor driving voltage.

16. A display device comprising:

a base layer in which a display area and a non-display area are defined;

a circuit layer on the base layer; and an element layer on the circuit layer and including a light emitting element and a light receiving element corresponding to the display area, wherein the circuit layer includes:

a pixel driving circuit connected to the light emitting element;

a sensor driving circuit connected to the light receiving element;

a read-out line connected to the sensor driving circuit;

a data line connected to the pixel driving circuit;

a driving voltage line connected to the pixel driving circuit; and a shielding electrode wiring including a part between the data line and the read-out line in a plan view, and the read-out line includes:

a first line part on a same layer as that of the shielding electrode wiring; and a second line part intersecting the shielding electrode wiring in the plan view, on a different layer from that of the shielding electrode wiring, and connected to the first line part.

17. The display device of claim 16, wherein the driving voltage line and the shielding electrode wiring are on a same layer, and the shielding electrode wiring extends from the driving voltage line.

18. The display device of claim 16, wherein the circuit layer further includes a reset voltage line connected to the sensor driving circuit, and the reset voltage line includes:

a horizontal reset voltage line extending in a first direction; and a vertical reset voltage line extending in a second direction intersecting the first direction and connected to the horizontal reset voltage line.

19. The display device of claim 18, wherein the vertical reset voltage line includes:

a first vertical reset voltage line on a first side of the sensor driving circuit; and a second vertical reset voltage line on a second side of the sensor driving circuit, and the reset voltage line further includes a connection line that connects the first vertical reset voltage line and the second vertical reset voltage line.

20. The display device of claim 19, wherein the shielding electrode wiring includes:

a first vertical part overlapping the first vertical reset voltage line;

a second vertical part overlapping the second vertical reset voltage line; and a horizontal part that connects the first vertical part and the second vertical part.

* * * * *